United States Patent
Singh et al.

(10) Patent No.: US 11,888,477 B2
(45) Date of Patent: Jan. 30, 2024

(54) DYNAMIC PULL-DOWN CIRCUITS FOR BIDIRECTIONAL VOLTAGE TRANSLATORS

(71) Applicant: TEXAS INSTRUMENTS INCORPORATED, Dallas, TX (US)

(72) Inventors: Ankur Kumar Singh, Bangalore (IN); Kanteti Amar, Mandavalli (IN); Rashmi Shahu, New Delhi (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 117 days.

(21) Appl. No.: 17/461,620

(22) Filed: Aug. 30, 2021

(65) Prior Publication Data
US 2022/0085812 A1    Mar. 17, 2022

(30) Foreign Application Priority Data
Sep. 16, 2020 (IN) .............................. 202041040196

(51) Int. Cl.
H03K 19/0185 (2006.01)

(52) U.S. Cl.
CPC ........................... H03K 19/018521 (2013.01)

(58) Field of Classification Search
None
See application file for complete search history.

(56) References Cited

U.S. PATENT DOCUMENTS

| 6,356,102 B1* | 3/2002 | Klein | H03K 17/164 |
| | | | 326/27 |
| 2009/0289693 A1* | 11/2009 | Motamed | H03K 19/00315 |
| | | | 327/437 |
| 2020/0313674 A1* | 10/2020 | Kanteti | H03K 3/356113 |

* cited by examiner

*Primary Examiner* — Anh Q Tran
(74) *Attorney, Agent, or Firm* — John R. Pessetto; Frank D. Cimino

(57) ABSTRACT

An example apparatus includes: an output terminal, pull-down circuitry coupled to the output terminal, the pull-down circuitry including: a resistor with a first resistor terminal and a second resistor terminal, the first resistor terminal coupled to the output terminal, a capacitor with a first capacitor terminal and a second capacitor terminal, the first capacitor terminal coupled to the output terminal, a first transistor coupled to the second resistor terminal, a second transistor coupled to the first transistor and the second resistor terminal, and a third transistor coupled to the second transistor.

15 Claims, 11 Drawing Sheets

DYNAMIC PULL-DOWN CIRCUITS FOR BIDIRECTIONAL VOLTAGE TRANSLATORS

CROSS-REFERENCE TO RELATED APPLICATION

This patent application claims the benefit of and priority to Indian Patent Application No. 202041040196 filed Sep. 16, 2020, which is hereby incorporated herein by reference in its entirety.

TECHNICAL FIELD

This description relates generally to voltage translators, and more particularly to dynamic pull-down circuits for bidirectional voltage translators.

BACKGROUND

Level shifters, also referred to as logic-level shifters or voltage level translators, are circuits used to translate signals from one logic level or voltage domain to another. Such level shifters achieve compatibility between integrated circuits with different voltage requirements, such as requirements based on transistor-transistor logic (TTL) or complementary metal-oxide-semiconductor (CMOS) logic.

SUMMARY

For dynamic pull down circuits for bidirectional voltage translators, an example apparatus includes an output terminal, pull-down circuitry coupled to the output terminal, the pull-down circuitry including: a resistor with a first resistor terminal and a second resistor terminal, the first resistor terminal coupled to the output terminal, a capacitor with a first capacitor terminal and a second capacitor terminal, the first capacitor terminal coupled to the output terminal, a first transistor coupled to the second resistor terminal, a second transistor coupled to the first transistor and the second resistor terminal, and a third transistor coupled to the second transistor.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
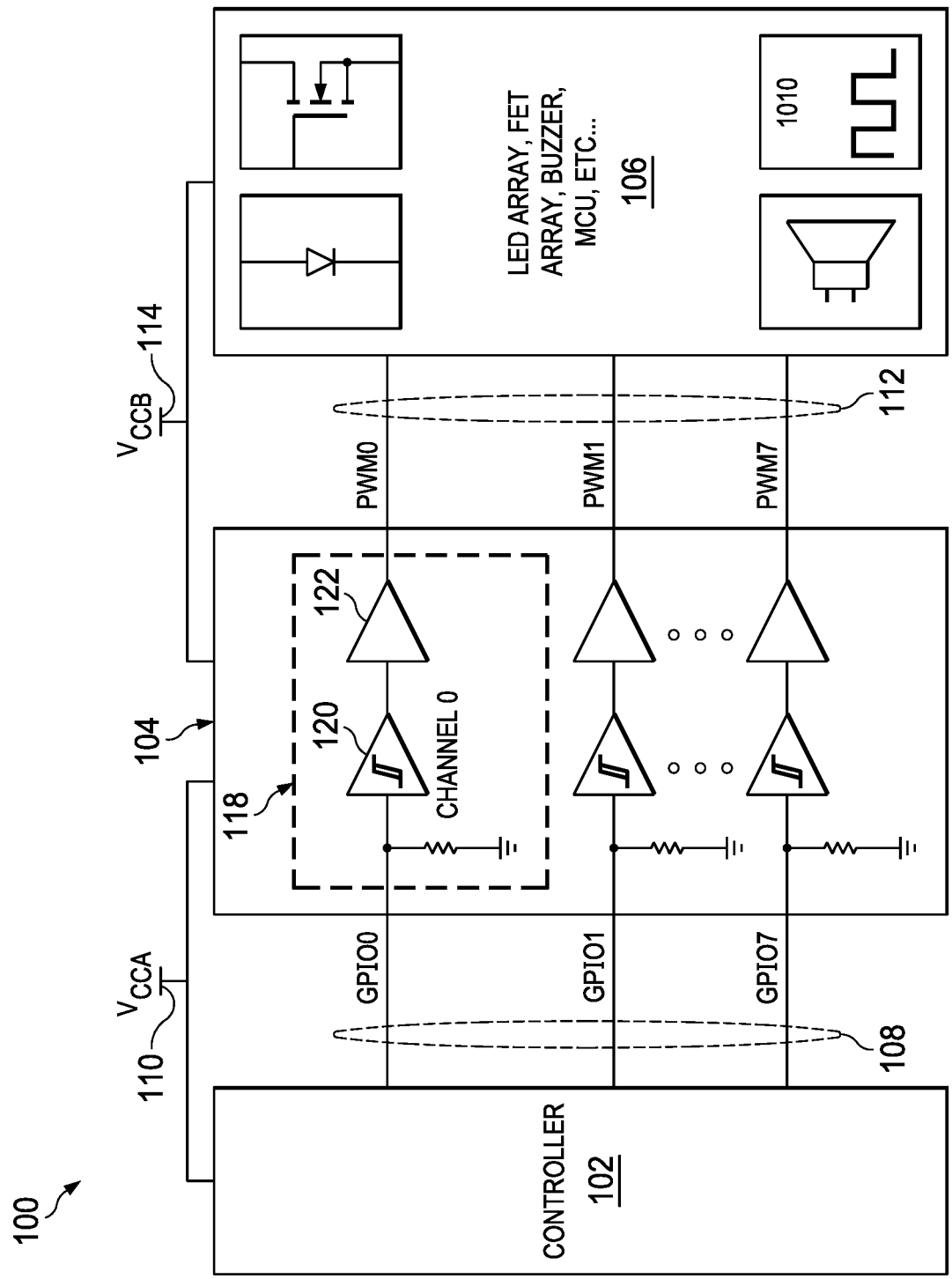
FIG. 1 is a block diagram of an example system including an example bidirectional voltage level translation integrated circuit.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Level shifters, also referred to as logic-level shifters or voltage level translators, are circuits used to translate signals from one logic level or voltage domain to another. Such level shifters achieve compatibility between integrated circuits with different voltage requirements, such as requirements based on transistor-transistor logic (TTL) or complementary metal-oxide-semiconductor (CMOS) logic. For example, systems may use level shifters to interface with legacy devices that operate at different voltage levels with respect to newer devices. In some examples, systems may include level shifters to implement communication protocols, which may include communication protocols based on Universal Serial Bus (USB), Serial Peripheral Interface (SPI), Inter-Integrated Circuit (I2C), Universal Asynchronous Receiver/Transmitter (UART), etc. In some examples, systems may include level shifters to achieve communication between processor circuitry and storage disks or storage devices, which may include Secure Digital (SD) devices, Subscriber Identity Module (SIM) devices, CompactFlash (CF) devices, etc. In some examples, systems may include level shifters to implement audio codecs to ensure audio signals that cross voltage levels are sampled correctly.

Some such level shifters may be bidirectional voltage translators that implement a transceiver. The transceiver may achieve data communication between two different logic levels or voltage domains. In some such bidirectional voltage translators, every output (such as an output node) may also operate as an input (such as an input node) for operation in the other direction. For example, a first port of the bidirectional voltage translator may be configured to receive a first signal with a first voltage (such as an input/output (I/O) voltage). The bidirectional voltage translator may translate, convert, and/or otherwise level shift the first voltage to a second voltage. The bidirectional voltage translator may deliver the first signal with the second voltage to a second port of the bidirectional voltage translator. In some such examples, the second port may be configured to receive a second signal with the second voltage. The bidirectional voltage translator may translate, convert, and/or otherwise level shift the second voltage to the first voltage. The bidirectional voltage translator may deliver the second signal with the first voltage to the first port.

Some bidirectional voltage translators may have relatively high currents and/or voltages at I/O ports of the bidirectional voltage translators when respective output drivers of the bidirectional voltage translators are disabled. Such relatively high voltages may discharge very slowly through leakage currents of transistors of the output drivers. Such a slow discharge of the I/O port voltages may cause the I/O port voltages to remain in a near mid-output supply range for a relatively long amount of time, which may cause a relatively substantial output supply current to flow through an input buffer circuit in the opposite direction.

Some bidirectional voltage translators may use a static pull-down circuit including a pull-down resistor at each I/O port to pull down the output voltage from a high voltage (such as 5 Volts (V), 5.5 V, etc.) to a low voltage (such as 0 V, approximately 0 V, etc.) when the corresponding output drivers are disabled. The resistance of the pull-down resistor may be substantially large to reduce the I/O port direct current (DC) current. In some such bidirectional voltage translators, the pull-down resistors may consume a relatively large amount of area (such as area on a printed circuit board (PCB), area on a semiconductor substrate, etc.) because each I/O port may have the pull-down resistor with the substantially large resistance. Accordingly, such static pull-down circuits are not area efficient solutions.

Some bidirectional voltage translators may use a dynamic pull-down circuit including a switch and a pull-down resistor. The switch may be triggered by an output driver disable signal and an inverted signal of the output itself. Some such dynamic pull-down circuits may not trigger a discharge of output load capacitors at the I/O ports relatively quickly because the I/O port voltages may discharge by way of leakage currents of transistors of the output drivers. For instance, the I/O port voltages may have to discharge through the leakage currents to a level that may be considered a logic low signal by an inverter of the bidirectional voltage translator that generates the inverted signal of the output itself. In some such instances, the I/O port voltages may discharge relatively slowly, which may cause a relatively high output supply current to remain in a near mid-output supply range for a relatively long amount of time. In some such instances, the high output supply current may cause a relatively substantial output supply current to flow through an input buffer circuit in the opposite direction.

Examples described herein include dynamic pull down circuits at I/O ports of bidirectional voltage translators to achieve improved output voltage discharge and decreased output supply current when output drivers of the bidirectional voltage translators are disabled. In some described examples, the dynamic pull down circuits include switches on each I/O ports to discharge the respective output voltages. In some described examples, a mono-shot pulse generator circuit may be controlled by at least one of a power-on reset (POR) output or an output enable (OE) port signal to trigger the dynamic pull down circuit at the I/O ports. In some such described examples, the mono-shot pulse generator circuit may control the switches to discharge the respective output voltages at an increased discharge rate compared to the above-described bidirectional voltage translators. In some described examples, the dynamic pull down circuits implement an area-efficient solution to pull down output node voltages of a bidirectional voltage translator relatively quickly to reduce and/or otherwise minimize supply currents of the bidirectional voltage translator.

FIG. 1 is a block diagram of an example system 100 including an example controller 102, a first example bidirectional voltage translator 104, and an example load 106. In some examples, the controller 102 may be implemented using hardware logic, machine readable instructions, hardware implemented state machines, etc., and/or a combination thereof. For example, the controller 102 may be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) (such as field programmable gate array(s))). In other examples, the controller 102 may be implemented using a transconductance amplifier (i.e., a GM amplifier).

In some examples, the first bidirectional voltage translator 104 (such as a bidirectional voltage level translator) may be implemented by one or more bidirectional voltage translation integrated circuits (such as bidirectional voltage level translation integrated circuits). The first bidirectional voltage translator 104 may convert, translate, and/or otherwise level shift first example signals 108 operating at a first example voltage ($V_{CCA}$) 110 to second example signals 112 operating at a second example voltage ($V_{CCB}$) 114. In some examples, the first voltage may be different than the second voltage. For example, the first voltage may be 1.1 V, 1.5 V, etc., and the second voltage may be 5 V, 5.5 V, etc. Advantageously, the first bidirectional voltage translator 104 may facilitate communication of data, signals, etc., between different logic levels and/or voltage domains. For example, the controller 102 may be configured and/or otherwise adapted to operate at a first logic level or voltage domain and the load 106 may be configured and/or otherwise adapted to operate at a second logic level or voltage domain. In some examples, the load 106 may be a light-emitting diode (LED) array (such as an array of one or more LEDs), a field-effect transistor (FET) array, an audio device such as a buzzer, a controller such as a microcontroller unit (MCU), etc., and/or a combination thereof.

In this example, the first bidirectional voltage translator 104 may be a transceiver, which receive and/or transmit signals bidirectionally. For example, the first bidirectional voltage translator 104 may receive the first signals 108, which may be implemented by general-purpose input/output (GPIO) signals, from the controller 102. In this example, the first bidirectional voltage translator 104 may output the second signals 112, which may be implemented by pulse-width modulation (PWM) signals, to the load 106. For example, the first bidirectional voltage translator 104 may generate and/or otherwise output the second signals 112 based on the first signals 108. In other example embodiments, the first bidirectional voltage translator 104 may function as a driver and utilize instructions/control signals (such as the first signals 108 GPIO0, GPIO1 . . . GPIO7, etc.) from the controller 102 to generate drive signals (such as the second signals 112, PWM0, PWM1 . . . PWM7, etc.) to drive the load 106.

The bidirectional voltage translator 104 of the illustrated example is an 8-bit translating transceiver in which each bit may be an example channel (such as a communication channel, a data channel, etc.) 118. In this example, one or more of the channels 118 of the first bidirectional voltage translator 104 may each include an example Schmitt trigger 120 and an example voltage translator 122. Alternatively, the first bidirectional voltage translator 104 may be implemented with any other type and/or quantity of hardware logic, machine readable instructions, hardware implemented state machines, etc., and/or a combination thereof. For example, the first bidirectional voltage translator 104 may be implemented by one or more analog or digital circuit(s), logic circuits, programmable processor(s), programmable controller(s), GPU(s), DSP(s), ASIC(s), PLD(s), and/or FPLD(s). As depicted in FIG. 1, an optional resistor is connected from the inputs 108 to a common potential (such as ground). In some example embodiments, the controller 102 is connected to a first voltage supply having a magnitude of the first voltage 110 and the load 106 is connected to a second voltage supply having a magnitude of the second voltage. The first voltage 110 and the second voltage 114 may be different voltages. The bidirectional voltage translator 104 may be connected to the first voltage supply (such as the first voltage 110) and/or the second voltage supply (such as the second voltage 114).

Advantageously, the system 100 of the illustrated example may implement and/or otherwise achieve level-translation applications for interfacing devices or systems operating at different interface voltages with one another. For example, the first bidirectional voltage translator 104 may be used to implement applications where a push-pull driver is coupled to data I/O.

Figure 2:
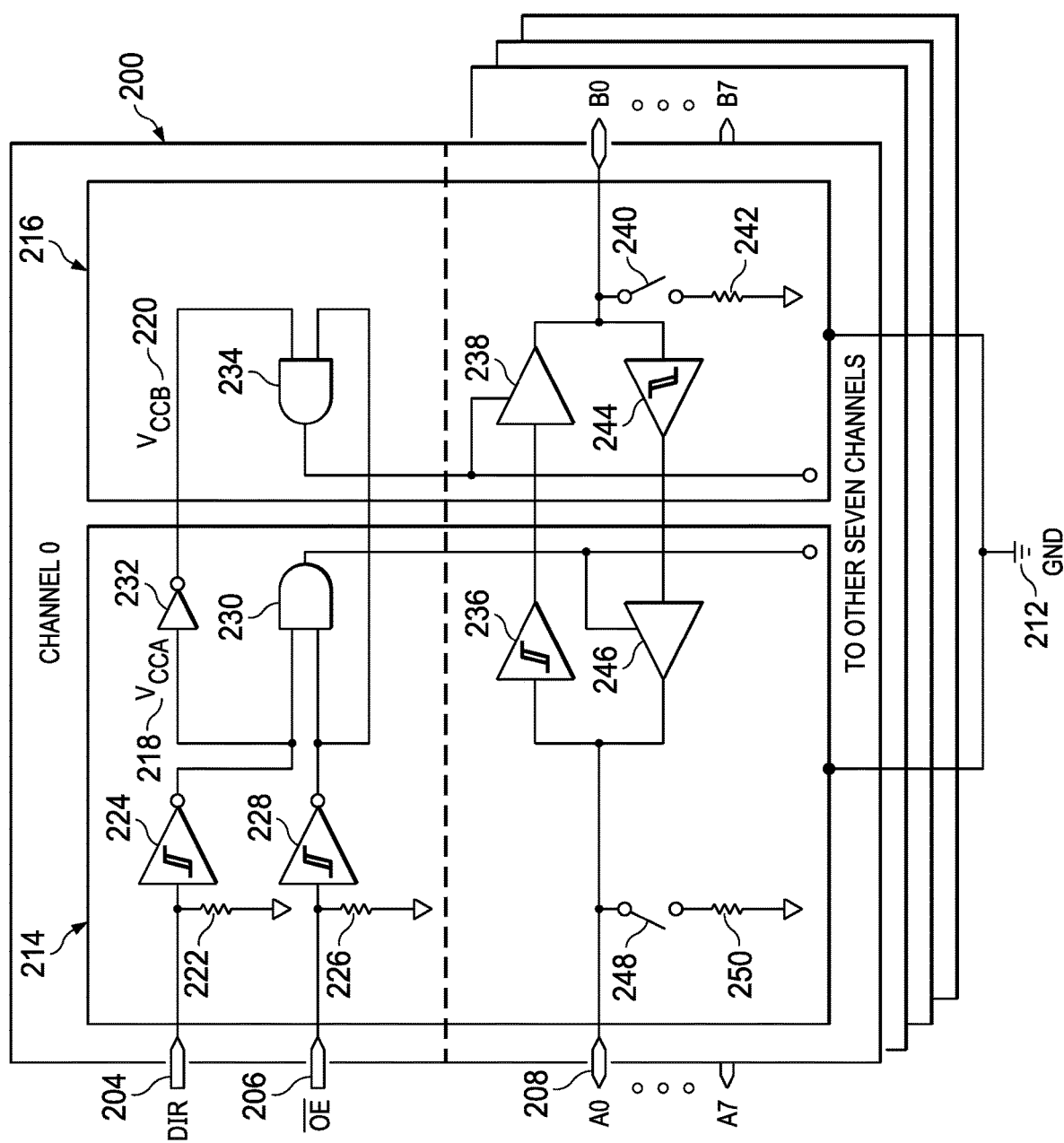
FIG. 2 is a schematic diagram of an example implementation of the bidirectional voltage level translation integrated circuit of FIG. 1.

FIG. 2 is a schematic diagram of a second example bidirectional voltage translator 200. In some examples, the second bidirectional voltage translator 200 of FIG. 2 may be an example implementation of the first bidirectional voltage translator 104 of FIG. 1, where I/O's GPIO0, GPIO1 . . . GPIO7 of FIG. 1 are similar to A0 . . . A7 of FIG. 2, respectively, and I/O's PWM0, PWM1 . . . PWM7 of FIG. 1 are similar to B0 . . . B7 of FIG. 2, respectively.

The second bidirectional voltage translator 200 includes eight channels (such as communication channels, data channels, etc.) including a first example channel (CHANNEL 0) 202 and seven other channels (not shown) having a similar structure as the first channel 202 and connected in a similar manner as the channels illustrated in the example of FIG. 1. One or more of the channels may each have an example direction (DIR) port 204, an example output enable (OE) port 206, one of first example bus ports (A0-A7) 208, and one of second example bus ports (B0-B7) 210. For example, the first channel 202 may have a first one (A0) of the first bus ports 208 and a first one (B0) of the second bus ports 210. One or more of the channels may be coupled to common potential (such as ground) 212. In some examples, at least one of the direction port 204, the output enable port 206, the first bus port 208, or the second bus port 210 of respective one(s) of the channels may be constructed and/or otherwise be composed of aluminum, copper, etc., or any other conductive material or combination thereof. For example, one(s) of the ports may be implemented by terminals, pins, legs, leads, lugs, or any other type of electrical contact.

One or more of the channels of the second bidirectional voltage translator 200 may each include a first example logic level or voltage domain 214 and a second example logic level or voltage domain 216. In this example, the first voltage domain 214 may be adapted to operate based on a first example voltage ($V_{CCA}$) 218. In this example, the second voltage domain 216 may be adapted to operate based on a second example voltage ($V_{CCB}$) 220. For example, the first voltage 218 may correspond to the first voltage 110 of FIG. 1 and/or the second voltage 220 may correspond to the second voltage 114 of FIG. 1.

One or more of the channels of the second bidirectional voltage translator 200 may each include a first example resistor 222, a first example Schmitt trigger 224, a second example resistor 226, a second example Schmitt trigger 228, a first example logic gate 230, a second example logic gate 232, a third example logic gate 234, a third example Schmitt trigger 236, a first example gate driver 238, a first example switch 240, a third example resistor 242, a fourth example Schmitt trigger 244, a second example gate driver 246, a second example switch 248, and a fourth example resistor 250. In this example, the first Schmitt trigger 224 and the second Schmitt trigger 228 are adapted and/or otherwise configured to have inverted output(s). In this example, the first voltage domain 214 includes the first resistor 222, the first Schmitt trigger 224, the second resistor 226, the second Schmitt trigger 228, the first logic gate 230, the second logic gate 232, the third Schmitt trigger 236, the second gate driver 246, the second switch 248, and the fourth resistor 250. In this example, the second voltage domain 216 includes the third logic gate 234, the first gate driver 238, the first switch 240, the third resistor 242, and the fourth Schmitt trigger 244.

In the illustrated example of FIG. 2, the direction port 204 is coupled to the first resistor 222 (such as a first resistor terminal) and first input(s) of the first Schmitt trigger 224. Output(s) of the first Schmitt trigger 224 is/are coupled to input(s) of the first logic gate 230 and input(s) of the second logic gate 232. The output enable port 206 is coupled to the second resistor 226 and input(s) of the second Schmitt trigger 228. Output(s) of the second Schmitt trigger 228 is/are coupled to second input(s) of the first logic gate 230 and first input(s) of the third logic gate 234. Output(s) of the second logic gate 232 is/are coupled to second input(s) of the third logic gate 234. Output(s) of the first logic gate 230 is/are coupled to first input(s) of the second gate driver 246 and to input(s) of one(s) of the other 7 channels. For example, the other 7 channels each include an instance of the second gate driver 246, and one(s) of the output(s) of the first logic gate 230 is/are coupled to first input(s) of the instances of the second gate driver 246 in the other 7 channels. Output(s) of the third logic gate 234 is/are coupled to first input(s) of the first gate driver 238 and to input(s) of one(s) of the other 7 channels. For example, the other 7 channels each include an instance of the first gate driver 238, and one(s) of the output(s) of the third logic gate 234 is/are coupled to first input(s) of the instances of the first gate driver 238 in the other 7 channels.

In the illustrated example of FIG. 2, the first one of the first bus ports 208 (identified by A0) is coupled to input(s) of the third Schmitt trigger 236, output(s) of the second gate driver 246, and the second switch 248 (such as a first switch terminal). The second switch 248 (such as a second switch terminal) is coupled to the fourth resistor 250, which is also coupled to ground at a second terminal. The first one of the second bus ports 210 (identified by B0) is coupled to input(s) of the fourth Schmitt trigger 244, output(s) of the first gate driver 238, and the first switch 240. The third resistor 242 is coupled between the first switch 240 and ground. The ground potential for the first voltage domain 214 may be different than (and/or isolated from) the ground potential for the second voltage domain 216.

In example operation, the second bidirectional voltage translator 200 implements an 8-bit dual-supply noninverting bidirectional voltage level translation device. In this example, the first bus ports 208 (each of which may be connected to a different channel—for example, A0 is connected to channel 0, A1 is connected to channel 1 . . . A7 is connected to channel 7) and the control pins, which may be implemented by the direction port 204 and the output enable port 206, are referenced to voltage levels of the first voltage 218. The second bus ports 210 (each of which may be connected to a different channel—for example, B0 is connected to channel 0, B1 is connected to channel 1 . . . B7 is connected to channel 7) are referenced to voltage levels of the second voltage 220. In example operation, the first bus ports 208 may be adapted and/or otherwise configured to accept I/O voltages in a range from 1.0 V (such as 1.0 V, 1.1 V, 1.2 V, etc.) to 6 V (such as 5.5 V, 5.6 V, 6 V, etc.) and the second bus ports 210 may be adapted and/or otherwise configured to accept I/O voltages in a range from 1.0 V to 6.0 V. In some examples, the first bus ports 208 are adapted to receive I/O voltages and/or adapted to output I/O voltages. For example, the first bus ports 208 may be input terminals or output terminals based on a selected direction of operation. In some examples, the second bus ports 210 are adapted to receive I/O voltages and/or adapted to output I/O voltages. For example, the second bus ports 210 may be input terminals or output terminals based on a selected direction of operation.

In example operation, in response to receiving a logic high signal (such as a voltage representative of a digital '1') on the direction port 204 and receiving a logic low signal (such as a voltage representative of a digital '0') on the output enable port 206, the second bidirectional voltage translator 200 achieves data transmission from one(s) of the first bus ports 208 to one(s) of the second bus ports 210. For example, the first Schmitt trigger 224 inverts the logic high signal from the direction port 204 to a logic low signal, which disables the first logic gate 230 and/or otherwise cause the first logic gate 230 to output a logic low signal, which disables and/or otherwise turns off the second gate driver 246. In some such examples, the second logic gate 232 inverts the logic low signal from the first Schmitt trigger 224 to generate a logic high signal. In response to the logic high signal from the second logic gate 232 and the second Schmitt trigger 228 inverting the logic low signal from the output enable port 206 to a logic high signal, the third logic gate 234 is enabled to output a logic high signal. In response to the logic high signal from the third logic gate 234, the first gate driver 238 is enabled and/or otherwise turned on to achieve data transmission from the first bus ports 208 to the second bus ports 210.

In example operation, in response to receiving a logic low signal on the direction port 204 and receiving a logic low signal on the output enable port 206, the second bidirectional voltage translator 200 achieves data transmission from one(s) of the second bus ports 210 to one(s) of the first bus ports 208. For example, the first Schmitt trigger 224 inverts the logic low signal from the direction port 204 to a logic high signal and the second Schmitt trigger 228 inverts the logic low signal from the output enable port 206 to a logic high signal, which enables the first logic gate 230 to cause the first logic gate 230 to output a logic high signal, which enables and/or otherwise turns on the second gate driver 246. In some such examples, the second logic gate 232 inverts the logic high signal from the first Schmitt trigger 224 to generate a logic low signal. In response to the logic low signal from the second logic gate 232, the third logic gate 234 is disabled to output a logic low signal. In response to the logic low signal from the third logic gate 234, the first gate driver 238 is disabled and/or otherwise turned off to achieve data transmission from the second bus ports 210 to the first bus ports 208.

Figure 3:
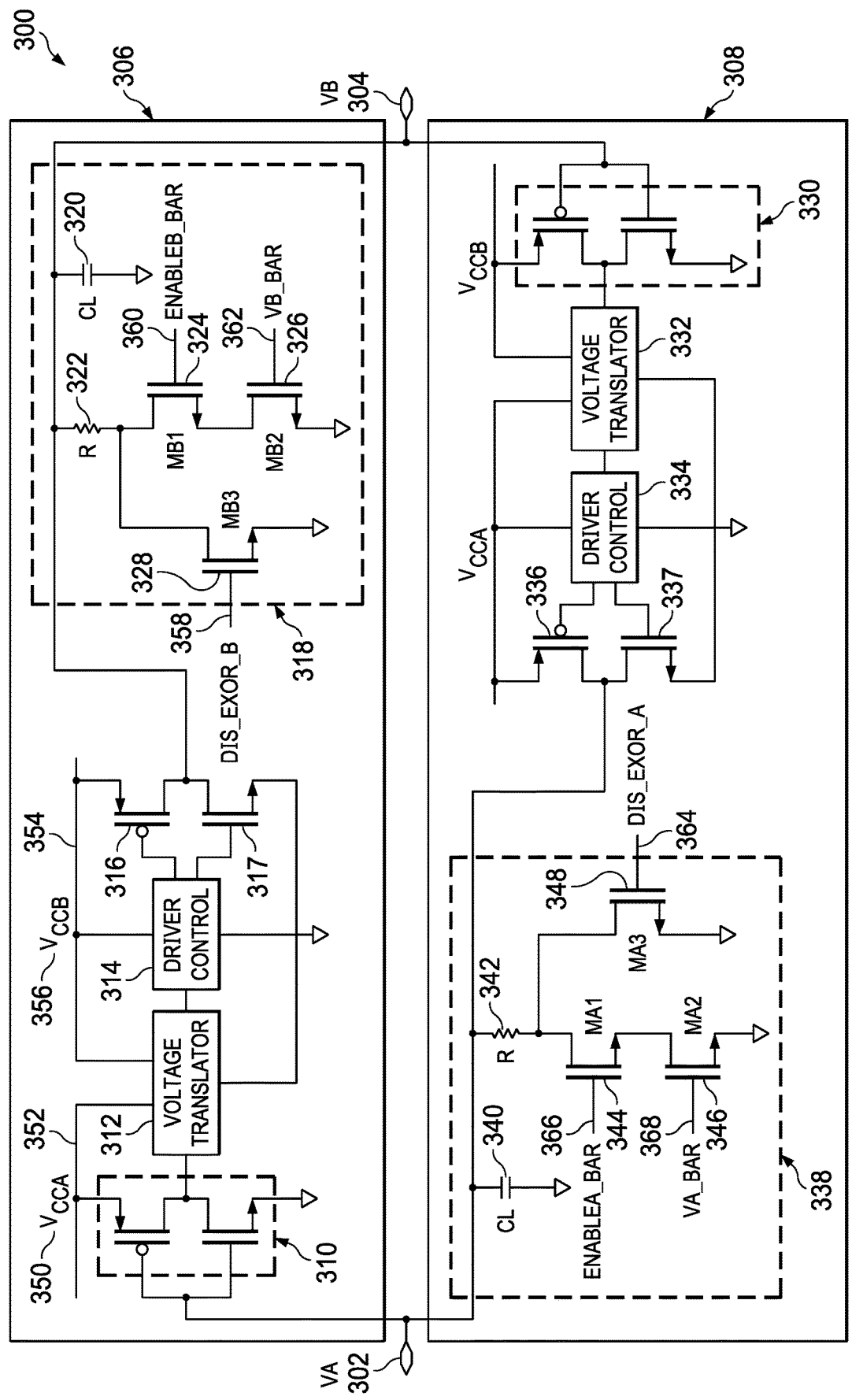
FIG. 3 is a schematic diagram of another example implementation of the bidirectional voltage level translation integrated circuit of FIG. 1.

FIG. 3 is a schematic diagram of a third example bidirectional voltage translator 300. In some examples, the third bidirectional voltage translator 300 may be the channel 118 of FIG. 1, and/or, more generally, the first bidirectional voltage translator 104 of FIG. 1. In some examples, the third bidirectional voltage translator 300 may be the first channel 202 of FIG. 2, and/or, more generally, the second bidirectional voltage translator 200 of FIG. 2. In some examples, the circuitry 300 is a bidirectional voltage translator for a single channel and is replicated to form a multi-channel bidirectional voltage translator where different ports 302 (such as 302-0 for channel 0, 302-1 for channel 1 . . . 302-n for channel n) are used at one end of each channel and different ports 304 (such as 304-0 for channel 0, 304-1 for channel 1 . . . 304-n for channel n) are used at the other end of each channel. In some examples, the third bidirectional voltage translator 300 may be a transceiver. For example, the third bidirectional voltage translator 300 may achieve communication, transmission, etc., of data in a first direction from a first example bus port (VA) 302 to a second example bus port (VB) 304 or in a second direction from the second bus port 304 to the first bus port 302.

In some examples, the third bidirectional voltage translator 300 may be a level shifter. For example, the third bidirectional voltage translator 300 may receive a first voltage at a first voltage level at the first bus port 302 and shift up and/or otherwise increase the first voltage to a second voltage at a second voltage level to output the second voltage at the second bus port 304. In some such examples, the third bidirectional voltage translator 300 may receive the second voltage at the second voltage level at the second bus port 304 and shift down and/or otherwise decrease to the first voltage to output the first voltage at the second voltage level at the first bus port 302.

The third bidirectional voltage translator 300 includes first example bus circuitry 306 and second example bus circuitry 308. In some examples, the first bus circuitry 306 may be first transceiver circuitry (such as first transceiver path circuitry) and/or the second bus circuitry 308 may be second transceiver circuitry (such as second transceiver path circuitry) when the third bidirectional voltage translator 300 is a transceiver. For example, the first bus port 302 may be a first data terminal and the second bus port 304 may be a second data terminal.

The first bus circuitry 306 includes a first example inverter 310, first example voltage translator circuitry 312, first example driver control circuitry 314, a first example driver transistor 316, a second example driver transistor 317, and first example pull-down circuitry 318. In this example, the first inverter 310 is a complementary metal-oxide semiconductor (CMOS) inverter. Alternatively, the first inverter 310 may be implemented with any other type of inverter and/or combination of one or more logic gates. In this example, the first pull-down circuitry 318 includes a first example capacitor 320, a first example resistor 322, a first example transistor (MB1) 324, a second example transistor (MB2) 326, and a third example transistor (MB3) 328. In this example, the first resistor 322 has a resistance R, which may be substantially large (such as 75 kiloohms (kΩ), 100 kΩ, 200 kΩ, etc.). The first capacitor 320 has a capacitance CL.

The second bus circuitry 308 includes a second example inverter 330, second example voltage translator circuitry 332, second example driver control circuitry 334, a third example driver transistor 336, a fourth example driver transistor 337, and second example pull-down circuitry 338. In this example, the second inverter 330 is a CMOS inverter.

Alternatively, the second inverter 330 may be implemented with any other type of inverter and/or combination of one or more logic gates. In this example, the second pull-down circuitry 338 includes a second example capacitor 340, a second example resistor 342, a fourth example transistor (MA1) 344, a fifth example transistor (MA2) 346, and a sixth example transistor (MA3) 348. In this example, the second resistor 342 has the resistance R. Alternatively, the second resistor 342 may have any other resistance. The second capacitor 340 has the capacitance CL. Alternatively, the second capacitor 340 may have any other capacitance.

The second driver transistor 317, the fourth driver transistor 337, the first transistor 324, the second transistor 326, the third transistor 328, the fourth transistor 344, the fifth transistor 346, and the sixth transistor 348 are N-channel field-effect transistors (FETs) (such as N-channel metal-oxide semiconductor field-effect transistors (MOSFETs), junction-field-effect transistors (JFETs), etc.). Alternatively, one or more of the second driver transistor 317, the fourth driver transistor 337, the first transistor 324, the second transistor 326, the third transistor 328, the fourth transistor 344, the fifth transistor 346, and/or the sixth transistor 348 may be any other type of switch or transistor (such as a P-channel FET, an N-channel insulated-gate bipolar transistor (IGBT), a bipolar junction transistor (BJT), etc.). The first driver transistor 316 and the third driver transistor 336 are P-channel FETs (such as P-channel MOSFETs, P-channel JFETs, IGBTs, BJTs, etc.) with an inverted input. Alternatively, the first driver transistor 316 and/or the third driver transistor 336 may be any other type of switch or transistor.

In some examples, the second inverter 330, the second voltage translator circuitry 332, the second driver control circuitry 334, the third driver transistor 336, the fourth driver transistor 337, the second pull-down circuitry 338, the second capacitor 340, the second resistor 342, the fourth transistor 344, the fifth transistor 346, and the sixth example transistor 348 may be implemented by and/or otherwise correspond to respective ones of the first inverter 310, the first voltage translator circuitry 312, the first driver control circuitry 314, the first driver transistor 316, the second driver transistor 317, the first pull-down circuitry 318, the first capacitor 320, the first resistor 322, the first transistor 324, the second transistor 326, and/or the third transistor 328.

In the illustrated example of FIG. 3, the first bus port 302 is coupled to input(s) (such as an inverter input or one or more inverter inputs) of the first inverter 310. Output(s) (such as an inverter output or one or more inverter outputs) of the first inverter 310 is/are coupled to input(s) (such as a control input or one or more control inputs, a voltage translation input or one or more voltage translation inputs, etc.) of the first voltage translator circuitry 312. Output(s) (such as a voltage translation output or one or more voltage translation outputs) of the first voltage translator circuitry 312 is/are coupled to input(s) (such as control input(s)) of the first driver control circuitry 314. Output(s) (such as control output(s)) of the first driver control circuitry 314 is/are coupled to control terminals (such as gate input(s), gate(s), gate terminal(s), etc.) of the first driver transistor 316 and the second driver transistor 317. A current terminal (such as a drain terminal) of the first driver transistor 316 and a current terminal (such as a drain terminal) of the second driver transistor 317 are coupled to the first resistor 322 (such as a first resistor terminal), the first capacitor 320 (such as a first capacitor terminal), and/or, more generally, to input(s) of the first pull-down circuitry 318. The current terminal (such as the drain terminals) of respective ones of the first driver transistor 316 and the second driver transistor 317 are coupled to the second bus port 304 and input(s) of the second inverter 330.

In the illustrated example of FIG. 3, the second bus port 304 is coupled to input(s) of the second inverter 330. Output(s) (such as a control output or one or more control outputs) of the second inverter 330 is/are coupled to input(s) (such as control input(s)) of the second voltage translator circuitry 332. Output(s) (such as control output(s)) of the second voltage translator circuitry 332 is/are coupled to input(s) (such as control input(s)) of the second driver control circuitry 334. Output(s) (such as control output(s)) of the second driver control circuitry 334 is/are coupled to control terminals (such as gates) of the third driver transistor 336 and the fourth driver transistor 337. A current terminal (such as a drain terminal) of the third driver transistor 336 and a current terminal (such as a drain terminal) of the fourth driver transistor 337 are coupled to the second resistor 342, the second capacitor 340, and/or, more generally, to input(s) of the second pull-down circuitry 338. The current terminals (such as the drain terminals) of respective ones of the third driver transistor 336 and the fourth driver transistor 337 are coupled to the first bus port 302 and the input(s) of the first inverter 310.

The first inverter 310 is coupled between a first example voltage (VCCA) 350 and a common potential (such as ground). For example, a current terminal (such as a source terminal) of one transistor of the first inverter 310 is coupled to a first example voltage terminal 352 that may be adapted to receive the first voltage 350. Input(s) of the first voltage translator circuitry 312, the first driver control circuitry 314, and a current terminal (such as a source terminal) of the first driver transistor 316 are coupled to a second example voltage terminal 354, which may be adapted to receive a second example voltage (VCCB) 356. The first voltage translator circuitry 312, the first driver control circuitry 314, and a current terminal (such as the source) of the second driver transistor 317 are coupled to common potential (such as ground).

The second inverter 330 is coupled between the second voltage 356 and a common potential (such as ground). For example, a current terminal (such as a source terminal) of one transistor of the second inverter 330 is coupled to the second voltage terminal 354 (that may be adapted to receive the second voltage 356) and a current terminal (such as a source terminal) of another transistor of the second inverter 330 is coupled to ground. Input(s) of the second voltage translator circuitry 332, the second driver control circuitry 334, and a source of the third driver transistor 336 are coupled to the first voltage terminal 352, which may be adapted to receive the first voltage 350. The second voltage translator circuitry 332, the second driver control circuitry 334, and a current terminal (such as the source) of the fourth driver transistor 337 are coupled to common potential (such as ground).

In some examples, at least one of the first voltage translator circuitry 312, the first driver control circuitry 314, the second voltage translator circuitry 332, or the second driver control circuitry 334 may be implemented with one or more hardware circuits (such as processor circuitry, discrete and/or integrated analog and/or digital circuitry, a field programmable gate array (FPGA), an application specific integrated circuit (ASIC), a comparator, an operational-amplifier (op-amp), a logic circuit, etc.) structured to perform the functions, operations, etc., as described herein.

In example operation, to achieve communication in a first direction such as from the first bus port 302 to the second bus port 304, the first inverter 310 is configured to receive an input voltage from the first bus port 302. For example, the input voltage may be representative of a logic high signal (such as 4.5 V, 5.0 V, etc.). The first inverter 310 inverts the logic high signal to a logic low signal, and outputs the logic low signal to the first voltage translator circuitry 312. The first voltage translator circuitry 312 translates, converts, and/or otherwise levels up the first voltage 350 to the second voltage 356, and outputs the second voltage 356 to the first driver control circuitry 314. In response to receiving the second voltage 356, the first driver control circuitry 314 generates and/or otherwise outputs a low voltage for a first driver control signal (such as a current or voltage) to turn on the first driver transistor 316 and a low voltage for a second driver control signal (such as a current or voltage) to turn off the second driver transistor 317. In response to receiving the first driver control signal, the first driver transistor 316 outputs the second voltage 356. Under these conditions, the second bus port 304 outputs the second voltage 356.

In example operation, in response to the communication in the first direction, the third bidirectional voltage translator 300 may disable output(s) of the third bidirectional voltage translator 300. For example, in response to achieving data communication in a first direction (such as from the first bus port 302 to the second bus port 304), the first driver control circuitry 314 outputs a high voltage for the first control signal to turn off the first driver transistor 316 and a low voltage for the second control signal to turn off the second driver transistor 317. Under these conditions, the second bus port 304 is left floating to enter into a high-impedance state. Similarly, the second driver control circuitry 334 outputs a high voltage for the first control signal to turn off the third driver transistor 336 and a low voltage for the second control signal to turn off the fourth driver transistor 337. Under these conditions, the first bus port 302 is left floating to enter into a high-impedance state.

In response to entering into the high-impedance state, the first pull-down circuitry 318 may pull down the second bus port 304 from the second voltage level to a third voltage level (such as approximately 0V, a voltage within a range of −0.1V to 0.1V, etc.). In example operation, a first example transistor control signal (DIS_EXOR_B) 358 is asserted (such as by mono-shot pulse generation circuitry, which may be implemented by the example mono-shot pulse generation circuitry 400 of FIG. 4) to turn on the third transistor 328. For example, the first capacitor 320 is coupled to ground through the third transistor 328 to pull down the voltage at the second bus port 304. In some such examples, the mono-shot pulse generation circuitry may generate the first transistor control signal 358 as a logic high signal in response to a determination to pull down the voltage at the second bus port 304 (such as by discharging the first capacitor 320 through the third transistor 328).

In example operation, control circuitry (such as controller circuitry, the controller 102 of FIG. 1, etc.) may generate at least one of a second example transistor control signal (ENABLEB_BAR) 360 or a third example transistor control signal (VB_BAR) 362. For example, the control circuitry may generate the second transistor control signal 360 as a logic high signal to turn on the first transistor 324, which may cause the voltage at the second bus port 304 to decrease. In some such examples, the control circuitry may generate the third transistor control signal 362 as a logic high signal to turn on the second transistor 326, which may cause the voltage at the second bus port 304 to decrease. In some such examples, the control circuitry may turn on the first transistor 324 and the second transistor 326 to fully turn on the discharge path of the first transistor 324 and the second transistor 326. For example, in response to a determination to disable the output at the second bus port 304, the control circuitry may cause the second transistor control signal 360 to go low (such as a low voltage), thereby causing the second transistor control signal 360 to go high (such as a high voltage). In some such examples, the control circuitry may cause the third transistor control signal 362 to go high (such as a high voltage). In such an example, both of the first and second transistors 324, 326 will turn on, thereby bringing the second bus port 304 to a lower voltage (such as possibly to ground).

In example operation, to achieve communication in a second direction such as from the second bus port 304 to the first port bus 302, the second inverter 330 is configured to receive an input voltage from the second bus port 304. For example, the input voltage may be representative of a logic high signal (such as 4.5V, 5.0V, etc.). The second inverter 330 may invert the logic high signal to a logic low signal, and output the logic low signal to the second voltage translator circuitry 332. The second voltage translator circuitry 332 may translate, convert, and/or otherwise level down the second voltage 356 to the first voltage 350, and output the first voltage 350 to the second driver control circuitry 334. In response to receiving the first voltage 350, the second driver control circuitry 334 may generate and/or otherwise output a low voltage for the first driver control signal to turn on the third driver transistor 336 and a low voltage for the second driver control signal to turn off the fourth driver transistor 337. In response to receiving the first driver control signal, the third driver transistor 336 turns on (such as conducts) thereby connecting the first voltage 350 to the drain of the third driver transistor 336. For example, the second driver control circuitry 334 may output the first driver control signal as a logic low signal that turns on the third driver transistor 336, thereby connecting the first voltage 350 to the first bus port 302.

In example operation, in response to the communication in the second direction, the third bidirectional voltage translator 300 may disable output(s) of the third bidirectional voltage translator 300. For example, in response to achieving data communication in a second direction (such as from the second bus port 304 to the first bus port 302), the first driver control circuitry 314 outputs a high voltage for the first control signal to turn off the first driver transistor 316 and a low voltage for the second control signal to turn off the second driver transistor 317. Under these conditions, the second bus port 304 is left floating to enter into a high-impedance state. Similarly, the second driver control circuitry 334 outputs a high voltage for the first control signal to turn off the third driver transistor 336 and a low voltage for the second control signal to turn off the fourth driver transistor 337. Under these conditions, the first bus port 302 is left floating to enter into a high-impedance state.

In example operation, the third bidirectional voltage translator 300 may disable output(s) of the third bidirectional voltage translator 300. For example, in response to achieving data communication in a first direction (such as from the first bus port 302 to the second bus port 304), the first driver control circuitry 314 outputs a high voltage for the first control signal to turn off the first driver transistor 316 and a low voltage for the second control signal to turn off the second driver transistor 317. Under these conditions, the source terminal of the first driver transistor 316 is coupled to the second voltage terminal 354 and the source terminal of the second driver transistor 317 is coupled to ground, which causes the second bus port 304 to enter into a high-impedance state. Similarly, the second driver control circuitry 334 outputs a high voltage for the first control signal to turn off the third driver transistor 336 and a low voltage for the second control signal to turn off the fourth driver transistor 337. Under these conditions, the source terminal of the third driver transistor 336 is coupled to the first voltage terminal 352 and the source terminal of the fourth driver transistor 337 is coupled to ground, which causes the first bus port 302 to enter into a high-impedance state.

In response to entering into the high-impedance state, the second pull-down circuitry 338 may pull down the first bus port 302 from the first voltage level to the third voltage level (such as approximately 0V, a voltage within a range of −0.1V to 0.1V, etc.). In example operation, the mono-shot pulse generation circuitry (such as the mono-shot pulse generation circuitry 400 of FIG. 4) may assert a fourth example transistor control signal (DIS_EXOR_A) 364 to turn on the sixth transistor 348 and pull down the voltage at the first bus port 302. For example, the second capacitor 340 is coupled to ground through the sixth transistor 348 to pull down the voltage at the first port 302. In some such examples, the mono-shot pulse generation circuitry may generate the fourth transistor control signal 364 as a logic high signal in response to a determination to pull down the voltage at the first bus port 302 (such as by discharging the second capacitor 340 through the sixth transistor 348).

In example operation, the control circuitry (such as controller circuitry, the controller 102 of FIG. 1, etc.) may generate at least one of a fifth example transistor control signal (ENABLEA_BAR) 366 or a sixth example transistor control signal (VA_BAR) 368. For example, the control circuitry may assert the fifth transistor control signal 366 as a logic high signal to turn on the fourth transistor 344, which may cause the voltage at the first bus port 302 to decrease. In some such examples, the control circuitry may assert the sixth transistor control signal 368 as a logic high signal to turn on the fifth transistor 346, which may cause the voltage at the first bus port 302 to decrease. In some such examples, the control circuitry may fully turn on the fourth transistor 344 and the fifth transistor 346 to connect the first bus port 302 to ground through the second resistor 342. For example, in response to a determination to disable the output at the first bus port 302, the control circuitry may assert the fifth transistor control signal 366. In some such examples, the control circuitry may assert the sixth transistor control signal 368.

Advantageously, the first pull-down circuitry 318 is an area efficient implementation to discharge (such as dynamically discharge) an output voltage at the second bus port 304 because the first pull-down circuitry 318 does not include a relatively large static pull-down resistor. Advantageously, the first pull-down circuitry 318 achieves pulling down the output voltage at the second bus port 304 quickly to avoid relatively large output supply current (such as 100 milliamperes (mA), 200 mA, 500 mA, etc.) flowing through the other direction (such as from the second bus port 304 to the first bus port 302).

Advantageously, the second pull-down circuitry 338 is an area efficient implementation to discharge (such as dynamically discharge) an output voltage at the first bus port 302 because the first pull-down circuitry 318 does not include a relatively large static pull-down resistor. Advantageously, the first pull-down circuitry 318 achieves pulling down the output voltage at the second bus port 304 quickly to avoid relatively large output supply current (such as 100 milliamperes (mA), 200 mA, 500 mA, etc.) flowing through the other direction (such as from the second bus port 304 to the first bus port 302).

Figure 4:
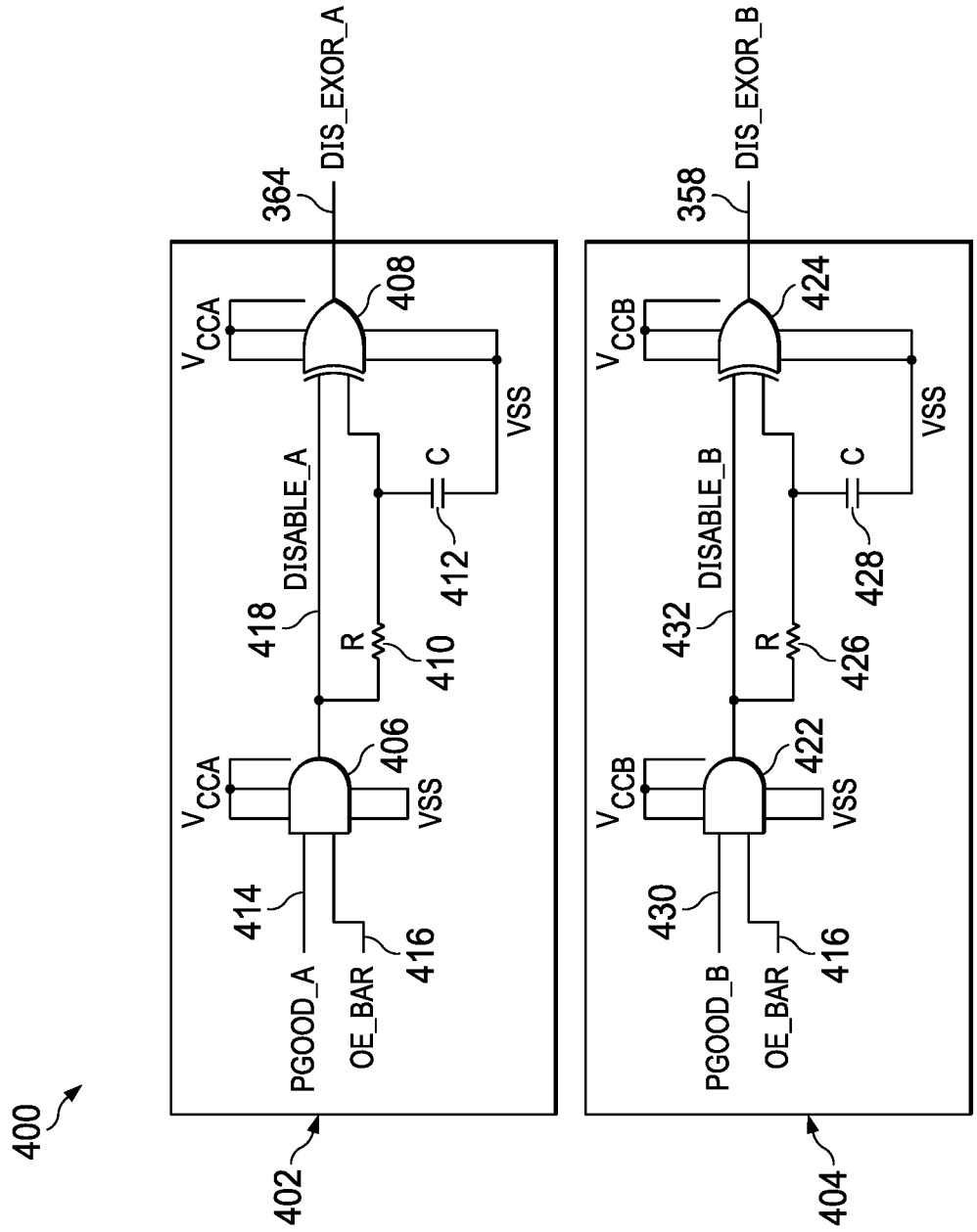
FIG. 4 is a schematic diagram of an example implementation of mono-shot pulse generation circuitry.

FIG. 4 is a schematic diagram of an example implementation of mono-shot pulse generation circuitry 400. For example, the mono-shot pulse generation circuitry 400 may be the mono-shot pulse generation circuitry discussed above in connection with FIG. 3. In the illustrated example of FIG. 4, the mono-shot pulse generation circuitry 400 includes first example pulse generation circuitry 402 and second example pulse generation circuitry 404. In some examples, the mono-shot pulse generation circuitry 400 may be implemented by a single integrated circuit (IC). For example, the first pulse generation circuitry 402 and the second pulse generation circuitry 404 may be part of the same IC. In some examples, the mono-shot pulse generation circuitry 400 may be implemented by more than one IC. For example, the first pulse generation circuitry 402 may be part of and/or otherwise implement a first IC and the second pulse generation circuitry 404 may be part of and/or otherwise implement a second IC.

The first pulse generation circuitry 402 includes a first example logic gate 406, a second example logic gate 408, a first example resistor 410 having a resistance R, and a first example capacitor 412 having a capacitance C. The first capacitor 412 is coupled between one input of the second logic gate 408 and VSS (such as ground). The first logic gate 406 is an AND logic gate. The second logic gate 408 is an exclusive OR (XOR) logic gate. Alternatively, the first logic gate 406 and/or the second logic gate 408 may be implemented by any other type of logic gate and/or combination of logic gates.

In the illustrated example of FIG. 4, input(s) (such as a logic gate input or one or more logic gate inputs) of the first logic gate 406 is/are coupled to control or controller circuitry (such as the controller 102 of FIG. 1, etc.). Output(s) (such as a logic gate output or one or more logic gate outputs) of the first logic gate 406 is/are coupled to the first resistor 410 and first input(s) of the second logic gate 408. The first resistor 410 is coupled to the first capacitor 412 and second input(s) of the second logic gate 408. Output(s) of the second logic gate 408 is/are coupled to pull-down circuitry such as the second pull-down circuitry 338 of FIG. 3. For example, output(s) of the second logic gate 408 may be coupled to a gate (such as a gate terminal) of the sixth transistor 348 of FIG. 3.

The first logic gate 406 is configured to receive a first example input signal (PGOOD_A) 414 and a second example input signal (OE_BAR) 416. In some examples, the first input signal 414 and/or the second input signal 416 may be generated by the control or controller circuitry (such as the controller 102 of FIG. 1, etc.). For example, the first input signal 414 may be a power good (PGOOD) signal representative of whether at least one of the first voltage 350 of FIG. 3 or the second voltage 356 of FIG. 3 is/are greater than a threshold (such as a voltage threshold, an undervoltage lockout (UVLO) threshold, etc.). In some such examples, in response to turning on and/or otherwise powering on the third bidirectional voltage translator 300 of FIG. 3, the control circuitry may output a logic high signal as the first input signal 414 when the first voltage 350 is greater than a first voltage threshold of 0.8V, 1.0V, etc. In some examples, the second input signal 416 may be an inverted output enable (OE) signal representative of whether an output of the first bus port 302 of FIG. 3 is to be enabled or disabled. For example, the control circuitry may output a logic high signal for the OE signal of the first bus port 302 in response to a determination to enable the output at the first bus port 302. In response to the OE signal being asserted (such as a logic high value), the second input signal 416 will be de-asserted (such as a logic low value) because the second input signal 416 is the inverse of the OE signal. In some examples, the control circuitry may output a logic low signal for the OE signal of the first bus port 302 in response to a determination to disable the output at the first bus port 302. In response to the OE signal being de-asserted (such as a logic low value), the second input signal 416 will be asserted (such as a logic high value) because the second input signal 416 is the inverse of the OE signal.

The first logic gate 406 and the second logic gate 408 are coupled to a first voltage domain, VCCA, which may correspond to the first voltage 350 of FIG. 3. The first logic gate 406 may output a first example disable signal (DISABLE_A) 418 in response to receiving logic high signals for the first input signal 414 and the second input signal 416. For example, in response to a determination by the first logic gate 406 that the first voltage 350 is greater than the first voltage threshold and that the output at the first bus port 302 is to be disabled, the first logic gate 406 generates a logic high signal as the first disable signal 418.

The first resistor 410 and the first capacitor 412 may be a first RC network. For example, the first RC network may store a first voltage at a logic low level at a first time. The first time can be prior to the first logic gate 406 outputting a logic high level for the first disable signal 418. At the first time, the first RC network may store the first voltage across the first capacitor 412. The first logic gate 406 can output the logic high level for the first disable signal 418 at a second time after the first time. In response to the logic high level for the first disable signal 418, the first RC network begins to charge from the first voltage to a second voltage of the first disable signal 418 (such as a logic high level). The second logic gate 408 outputs a logic high level for the fourth transistor control signal 364 at the second time (or shortly after the second time based on electrical signal propagation delays). The second logic gate 408 outputs a logic high level for the fourth transistor control signal 364 from the second time until a third time. The third time may be the time at which the first RC network charges (such as the first capacitor 412 charging) from the first voltage to the second voltage or a third voltage. For example, the third voltage may be a voltage at which an input of the second logic gate 408 identifies a logic high level of a signal at the input. The time difference between the first time and the second time (or between the first time and the third time) is based on a charging characteristic of the first RC network, which may implement a rising exponential curve. In response to the first RC network charging to the second voltage or the third voltage, the second logic gate 408 outputs a logic low level for the fourth transistor control signal 364. Under these conditions, the logic high level for the fourth transistor control signal 364 is a mono-shot signal (such as a mono-shot pulse) because the time difference between the first time and the second time (or between the first time and the third time) is relatively small due to the exponential charging characteristic of the first RC network. Under these conditions, the first pulse generation circuitry 402 may generate the fourth transistor control signal 364 to control the sixth transistor 348 of FIG. 3 (such as turn on the sixth transistor 348, turn off the sixth transistor 348, etc.).

Advantageously, the first pulse generation circuitry 402 may output the fourth transistor control signal 364 of FIG. 3 whenever output drivers are disabled either by decreasing (such as ramping down) a supply voltage (such as the first voltage 350 of FIG. 3), which may cause the first input signal 414 to transition between states, or by changing a voltage at the OE port (such as the OE port 206 of FIG. 2), which may cause the second input signal 416 to transition between states. Advantageously, the first pulse generation circuitry 402 may turn on the sixth transistor 348 of FIG. 3 to initialize a discharge of the second capacitor 340 of FIG. 3. Advantageously, the first pulse generation circuitry 402 achieves an area efficient implementation to pull down an output node voltage at the first bus port 302 relatively quickly to avoid a relatively large output supply current to flow from the second bus port 304 to the first bus port 302.

The second pulse generation circuitry 404 includes a third example logic gate 422, a fourth example logic gate 424, a second example resistor 426, and a second example capacitor 428. The third logic gate 422 is an AND logic gate. The fourth logic gate 424 is an XOR logic gate. Alternatively, the third logic gate 422 and/or the fourth logic gate 424 may be implemented by any other type of logic gate and/or combination of logic gates. The second resistor 426 has the resistance R, but may alternatively have any other resistance. The second capacitor 428 has the resistance C, but may alternatively have any other capacitance. The capacitor 428 is coupled between one input of the fourth logic gate 424 and VSS (such as ground).

Input(s) of the third logic gate 422 is/are coupled to the control or controller circuitry (such as the controller 102 of FIG. 1, etc.). Output(s) of the third logic gate 422 is/are coupled to the second resistor 426 and first input(s) of the fourth logic gate 424. The second resistor 426 is coupled to the second capacitor 428 and second input(s) of the fourth logic gate 424. Output(s) of the fourth logic gate 424 is/are coupled to pull-down circuitry such as the first pull-down circuitry 318 of FIG. 3. For example, output(s) of the fourth logic gate 424 may be coupled to a gate (such as a gate terminal) of the third transistor 328 of FIG. 3.

The third logic gate 422 is configured to receive a third example input signal (PGOOD_B) 430 and the second input signal 416. In some examples, the third input signal 430 may be generated by the control or controller circuitry (such as the controller 102 of FIG. 1, etc.). For example, the third input signal 430 may be a power good (PGOOD) signal representative of whether at least one of the first voltage 350 of FIG. 3 or the second voltage 356 of FIG. 3 is/are greater than a threshold (such as a voltage threshold, a UVLO threshold, etc.). In some such examples, the first input signal 414 and the third input signal 430 are dependent signals on both voltage supplies VCCA (such as the first voltage 350) and VCCB (such as the second voltage 356). For example, in response to VCCA and/or VCCB decreasing below a threshold, such as a UVLO threshold, the first input signal 414 and the second input signal 430 transition from a logic high signal to a logic low signal, which cause the first logic gate 406 and the third logic gate 422 to transition from outputting a logic high signal to outputting a logic low signal.

In some examples, in response to turning on and/or otherwise powering on the third bidirectional voltage translator 300 of FIG. 3, the control circuitry may output a logic high signal as the third input signal 430 when the second voltage 356 is greater than a second voltage threshold of 5.0V, 5.5V, etc. In some examples, the second input signal 416 may be an inverted output enable (OE) signal representative of whether an output of the second bus port 304 of FIG. 3 is to be enabled or disabled. For example, the control circuitry may output a logic high signal for the OE signal of the second bus port 304 in response to a determination to enable the output at the second bus port 304. In response to the OE signal being asserted (such as a logic high value), the second input signal 416 will be de-asserted (such as a logic low value) because the second input signal 416 is the inverse of the OE signal. In some examples, the control circuitry may output a logic low signal for the OE signal of the second bus port 304 in response to a determination to disable the output at the second bus port 304. In response to the OE signal being de-asserted (such as a logic low value), the second input signal 416 will be asserted (such as a logic high value) because the second input signal 416 is the inverse of the OE signal.

The third logic gate 422 and the fourth logic gate 424 are coupled to a second voltage domain, VCCB, which may correspond to the second voltage 356 of FIG. 3. The third logic gate 422 may output a second example disable signal (DISABLE_B) 432 in response to receiving logic high signals for the second input signal 416 and the third input signal 430. For example, in response to a determination that the second voltage 356 is greater than the second voltage threshold and that the output at the second bus port 304 is to be disabled, the third logic gate 422 generates a logic high signal as the second disable signal 432.

The second resistor 426 and the second capacitor 428 may be a second RC network. For example, the second RC network may store a first voltage at a logic low level at a first time. The first time can be prior to the third logic gate 422 outputting a logic high level for the second disable signal 432. At the first time, the second RC network may store the first voltage across the second capacitor 428. The third logic gate 422 can output the logic high level for the second disable signal 432 at a second time after the first time. In response to the logic high level for the second disable signal 432, the second RC network begins to charge from the first voltage to a second voltage of the second disable signal 432 (such as a logic high level). The fourth logic gate 424 outputs a logic high level for the first transistor control signal 358 at the second time (or shortly after the second time based on electrical signal propagation delays). The fourth logic gate 424 outputs a logic high level for the first transistor control signal 358 from the second time until a third time. The third time may be the time at which the second RC network charges (such as the second capacitor 428 charging) from the first voltage to the second voltage or a third voltage. For example, the third voltage may be a voltage at which an input of the fourth logic gate 424 identifies a logic high level of a signal at the input. The time difference between the first time and the second time (or between the first time and the third time) is based on a charging characteristic of the second RC network, which may implement a rising exponential curve. In response to the second RC network charging to the second voltage or the third voltage, the fourth logic gate 424 outputs a logic low level for the first transistor control signal 358. Under these conditions, the logic high level for the first transistor control signal 358 is a mono-shot signal (such as a mono-shot pulse) because the time difference between the first time and the second time (or between the first time and the third time) is relatively small due to the exponential charging characteristic of the second RC network. Under these conditions, the second pulse generation circuitry 404 may generate the first transistor control signal 358 to control the third transistor 328 of FIG. 3 (such as turn on the third transistor 328, turn off the third transistor 328, etc.).

Advantageously, the second pulse generation circuitry 404 may output the first transistor control signal 358 whenever output drivers are disabled either by decreasing (such as ramping down) a supply voltage (such as the second voltage 356 of FIG. 3), which may cause the third input signal 430 to transition between states, or by changing a voltage at the OE port (such as the OE port 206 of FIG. 2), which may cause the second input signal 416 to transition between states. Advantageously, the second pulse generation circuitry 404 may turn on the third transistor 328 of FIG. 3 to initialize a discharge of the first capacitor 320 of FIG. 3. Advantageously, the second pulse generation circuitry 404 achieves an area efficient implementation to pull down an output node voltage at the second bus port 304 relatively quickly to avoid a relatively large output supply current to flow from the first bus port 302 to the second bus port 304.

Figure 5:
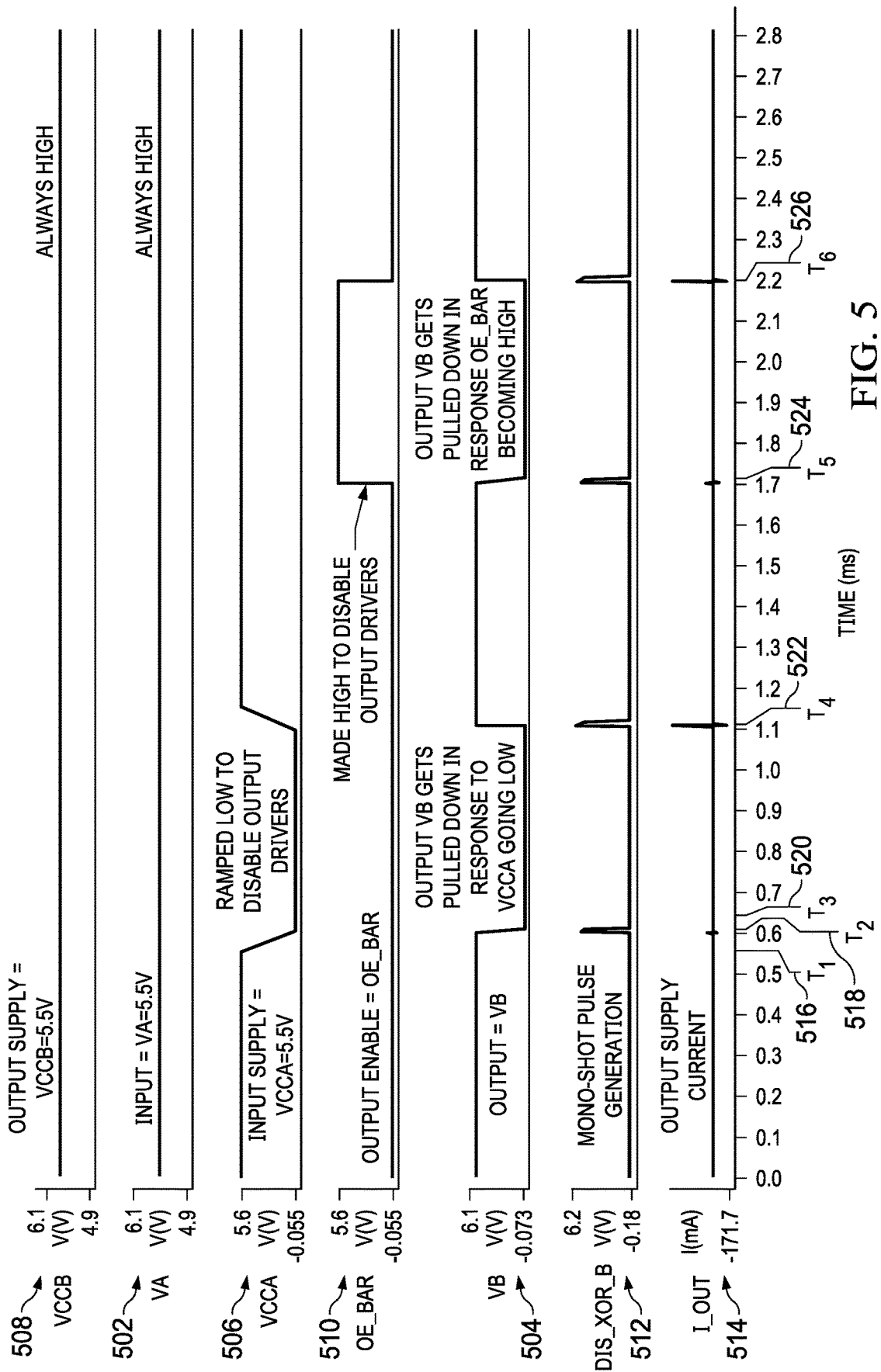
FIG. 5 is a timing diagram corresponding to example operation of the bidirectional voltage level translation integrated circuit of FIGS. 1, 2, and/or 3 and/or example operation of the example mono-shot pulse generation circuitry of FIG. 4.

FIG. 5 is a timing diagram 500 corresponding to example operation of the first bidirectional voltage translator 104 of FIG. 1, the second bidirectional voltage translator 200 of FIG. 2, the third bidirectional voltage translator 300 of FIG. 3 and/or example operation of the mono-shot pulse generation circuitry 400 of FIG. 4. The timing diagram 500 has an x-axis illustrating time (in milliseconds) and a y-axis illustrating voltage or current magnitude. The timing diagram 500 includes an example input voltage waveform 502 (identified by VA), an example output voltage waveform 504 (identified by VB), a first example voltage supply waveform 506 (identified by VCCA), a second example voltage supply waveform 508 (identified by VCCB), an example inverted output enable waveform 510 (identified by OE_BAR), an example mono-shot pulse generation signal waveform 512 (identified by DIS_XOR_B), and an example output current waveform 514 (identified by I_OUT). In this example, VA and VCCB remain high for explanatory purposes and may not always be high in operation. For example, VA and VCCB may have any other voltage at any point in operation.

In some examples, the input voltage waveform 502 may be a waveform of a voltage at the input of the channel 118 of FIG. 1, a voltage at the first one of the first bus ports 208 of FIG. 2, and/or a voltage at the first bus port 302 of FIG. 3. In some examples, the output voltage waveform 504 may be a waveform of a voltage at the output of the channel 118 of FIG. 1, a voltage at the first one of the second bus ports 210 of FIG. 2, and/or a voltage at the second bus port 304 of FIG. 3. In some examples, the first voltage supply waveform 506 may be a waveform of the first voltage 110 of FIG. 1, the first voltage 218 of FIG. 2, the first voltage 350 of FIG. 3, and/or VCCA of FIG. 4. In some examples, the second voltage supply waveform 508 may be a waveform of the second voltage 114 of FIG. 1, the second voltage 220 of FIG. 2, the second voltage 356 of FIG. 3, and/or VCCB of FIG. 4. In some examples, the inverted output enable waveform 510 may be a waveform of a voltage at the output enable port 206 of FIG. 2 and/or the second input signal 416 of FIG. 4. In some examples, the mono-shot pulse generation signal waveform 512 may be a waveform of the first transistor control signal 358 of FIG. 3. Alternatively, the mono-shot pulse generation signal waveform 512 may be a waveform of the fourth transistor control signal 364 of FIG. 3. In some examples, the output current waveform 514 may be a waveform of a current output from the voltage translator 122 of FIG. 1, a current output at the first one of the second bus ports 210, and/or a current output at the second bus port 304 of FIG. 3. Alternatively, the output current waveform 514 may be a waveform of a current output at the first one of the first bus ports 208 and/or a current output at the first bus port 302 of FIG. 3.

In the timing diagram 500, at a first example time ($T_1$) 516, VCCA begins to decrease from a first voltage (such as approximately 5.5V) to a second voltage (such as approximately 0V). For example, the first input signal 414 and the second input signal 430 may transition from a logic high signal to a logic low signal at the first time 516. In some such examples, VCCA may be ramped low to disable the output drivers (such as the first driver control circuitry 314 of FIG. 3) of the third bidirectional voltage translator 300. In some such examples, the first driver control circuitry 314 is disabled in response to the first voltage translator circuitry 312 outputting a logic low signal, which may be in response to the first voltage 350 decreasing below a voltage threshold (such as 1.0V, 1.1V, etc.).

At a second example time ($T_2$) 518, VCCA approaches the second voltage, which causes the DIS_XOR_B pulse to be generated. For example, in response to the first transistor control signal 358 transitioning from a logic low signal to a logic high signal, the third transistor 328 of FIG. 3 is turned on, which causes the voltage (such as VB in FIG. 5) at the second bus port 304 to decrease. In some such examples, in response to the second input signal 430 transitioning to a logic low signal, the third logic gate 422 outputs a logic low signal. The second disable signal 432, which is one of the inputs to the fourth logic gate 424, goes low to match the output of the third logic gate 422, but the other input to the fourth logic gate 424 goes high for a brief time as the charge from the second capacitor 428 is discharged through the second resistor 426. In response to the second disable signal 432 going low and the other input to the fourth logic gate 424 going high, the fourth logic gate 424 outputs a logic high level for the first transistor control signal 358 of FIG. 3 (and thereby generate the mono-shot pulse to turn on the third transistor 328). From the second time 518 until a fourth example time ($T_4$) 522, VB gets pulled down in response to VCCA going low. Advantageously, in response to pulling down VB, I_OUT is relatively low (such as 51.4379 nanoamperes (nA)) at a third example time ($T_3$) 520.

At the fourth time 522, VCCA ramps up to enable the output drivers (such as the first driver control circuitry 314 of FIG. 3) of the third bidirectional voltage translator 300. In some such examples, the first driver control circuitry 314 is enabled in response to the first voltage translator circuitry 312 outputting a logic high signal, which may be in response to the first voltage 350 increasing above a voltage threshold (such as 1.0V, 1.1V, etc.). At the fourth time 522, the DIS_XOR_B pulse is generated. For example, in response to the first voltage 350 increasing above the voltage threshold, the first input signal 414 and the third input signal 430 transition from a logic low signal to a logic high signal. In some such examples, because the second input signal 416 is in a logic high state, the first logic gate 406 and the third logic gate 422 transition from outputting logic low signals to outputting logic high signals. In response to the first logic gate 406 and the third logic gate 422 outputting logic high signals, the second logic gate 408 and the fourth logic gate 424 output logic high signals. Under these conditions, the first disable signal 418 and the second disable signal 432 are high to match the outputs of the first logic gate 406 and the third logic gate 422, respectively, and the other inputs to the second logic gate 408 and the fourth logic gate 424 will initially be low as the first capacitor 412 and the second capacitor 428 are charged but will transition to high when the capacitors 412, 428 are charged. In response to the disable signals 418, 432 being high, which are ones of the inputs to the second and fourth logic gates 408, 424, and the other inputs to the second and fourth logic gates 408, 424 being low, the second and fourth logic gates 408, 424 output a logic high level for a brief period of time as the fourth transistor control signal 364 of FIG. 3 and the first transistor control signal 358 of FIG. 3, respectively, each of which implement mono-shot pulses.

At a fifth example time ($T_5$) 524, the output drivers are disabled output enable (OE) signal to transitioning to a logic low state and the OE_BAR signal to transition to a logic high state. At the fifth time 524, the DIS_XOR_B pulse is generated. For example, in response to VCCB being greater than a voltage threshold (such as 1.0V, 1.1V, etc.), the third input signal 430 of FIG. 4 is a logic high signal. In some such examples, the second input signal 416 of FIG. 4 is a logic high signal, which causes the third logic gate 422 of FIG. 4 to output a logic high signal for the second disable signal 432 of FIG. 4. In some such examples, in response to the second disable signal 432 changing states to a logic high signal, the fourth logic gate 424 outputs a logic high signal for DIS_XOR_B (such as the first transistor control signal 358 of FIG. 3). In response to the DIS_XOR_B pulse being generated at the fifth time 524, VB gets pulled down relatively quickly. Advantageously, in response to VB getting pulled down and/or otherwise decreased, I_OUT is relatively low (such as 779.324 nA). At a sixth example time ($T_6$) 526, OE_BAR is made low to enable the output drivers to resume operation of the third bidirectional voltage translator 300, which causes VB to increase.

Figure 6:
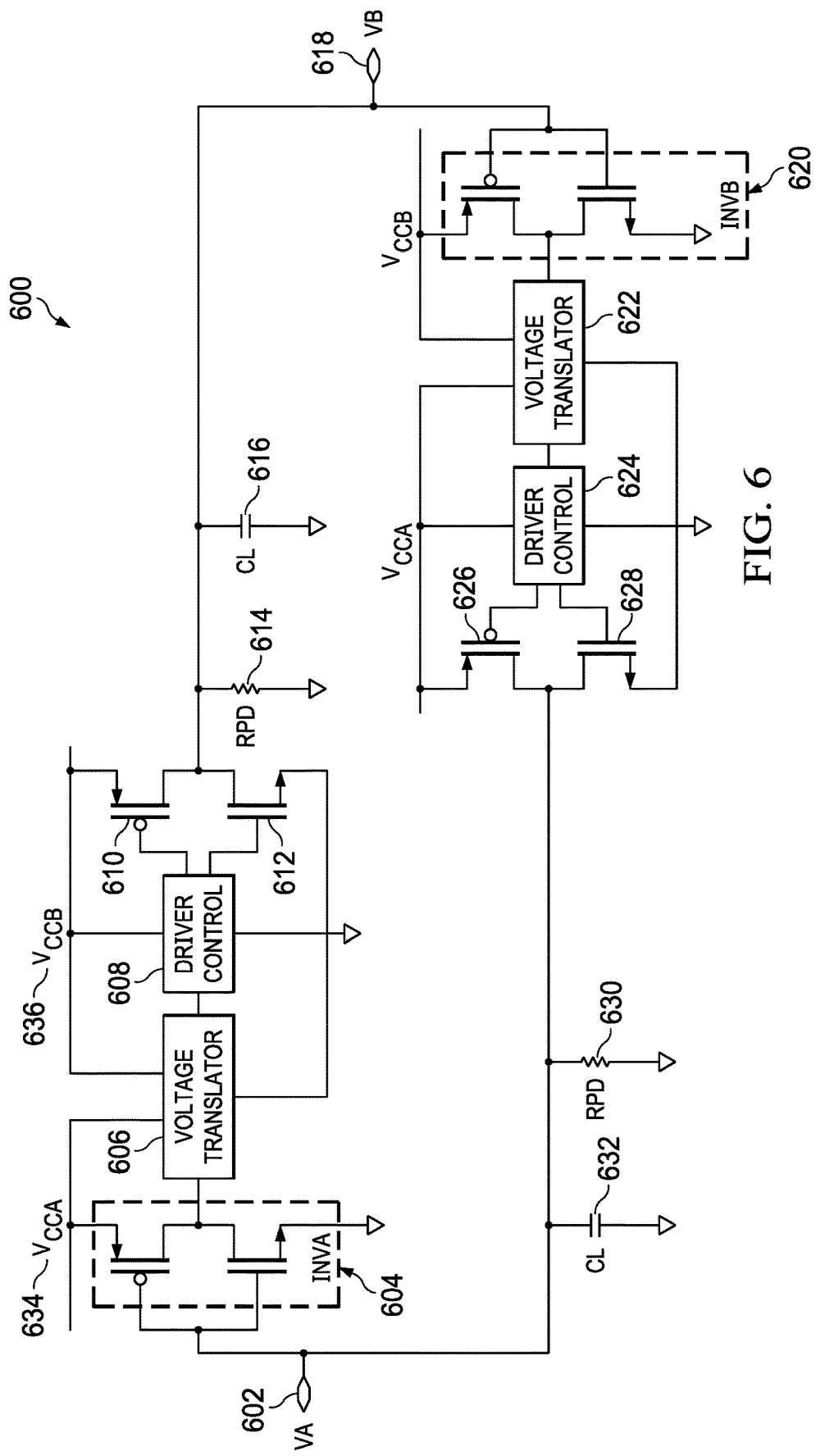
FIG. 6 is a schematic diagram of yet another example implementation of the bidirectional voltage level translation integrated circuit of FIG. 1.

FIG. 6 is a schematic diagram of a fourth example bidirectional voltage translator 600. In some examples, the fourth bidirectional voltage translator 600 may be an implementation of a single channel (such as channel 0) of the first bidirectional voltage translator 104 of FIG. 1 (such as VA may be equivalent to GPIO0 and VB may be equivalent to PWM0 of FIG. 1). The fourth bidirectional voltage translator 600 includes a first example bus port 602 (identified by VA), a first example inverter 604 (identified by INVA), first example voltage translator circuitry 606, first example driver control circuitry 608, a first example driver transistor 610, a second example driver transistor 612, a first example resistor 614, a first example capacitor 616, a second example bus port 618 (identified by VB), a second example inverter 620 (identified by INVB), second example voltage translator circuitry 622, second example driver control circuitry 624, a third example driver transistor 626, a fourth example driver transistor 628, a second example resistor 630, and a second example capacitor 632.

In the illustrated example of FIG. 6, the first resistor 614 and the second resistor 630 have a resistance RPD. The resistance RPD is substantially larger (such as 5 megaohms (MΩ), 5.5 MΩ, etc.) than the resistance R (such as 75 kΩ, 100 kΩ, etc.) of FIG. 3 and thereby the first resistor 614 and the second resistor 630 of FIG. 6 are greater in size than respective ones of the first resistor 322 and the second resistor 342 of FIG. 3. The first capacitor 616 and the second capacitor 632 have a capacitance CL. The first inverter 604, the first voltage translator circuitry 606, the second voltage translator circuitry 622, the second driver control circuitry 624, and the third driver transistor 626 are configured to receive a first example voltage 634 (identified by VCCA). The first voltage translator circuitry 606, the first driver control circuitry 608, the first driver transistor 610, the second inverter 620, and the second voltage translator circuitry 622 are configured to receive a second example voltage 636 (identified by VCCB).

The fourth bidirectional voltage translator 600 includes the first resistor 614 and the second resistor 630 as static pull down resistors to pull down voltages at the outputs (such as the first bus port 602 and the second bus port 618. Advantageously, the third bidirectional voltage translator 300 is an improvement over the fourth bidirectional voltage translator 600 because the first resistor 322 and the second resistor 342 of FIG. 3 are smaller in size and thereby the third bidirectional voltage translator 300 is more area efficient than the fourth bidirectional voltage translator 600. For example, for a multi-I/O bidirectional voltage translator (such as a 16 I/O bidirectional voltage translator), an instance of the first resistor 614 and/or the second resistor 630 is needed at every I/O port (such as the first bus port 602 and the second bus port 618) to reduce I/O port DC current. In some such examples, the first resistor 614 and/or the second resistor 630 at every I/O port consumes a relatively large amount of area (such as area on a printed circuit board (PCB) or semiconductor substrate) and is a less area efficient solution compared to the third bidirectional voltage translator 300. Advantageously, the third bidirectional voltage translator 300 is an improvement over the fourth bidirectional voltage translator 600 because one(s) of the transistors 324, 326, 328, 344, 346, 348 of FIG. 3 achieve dynamic control of the output voltage at the I/O ports whereas the resistors 614, 630 of FIG. 6 achieve static control and may thereby dissipate more power compared to the dynamic control achieved by the third bidirectional voltage translator 300.

Figure 7:
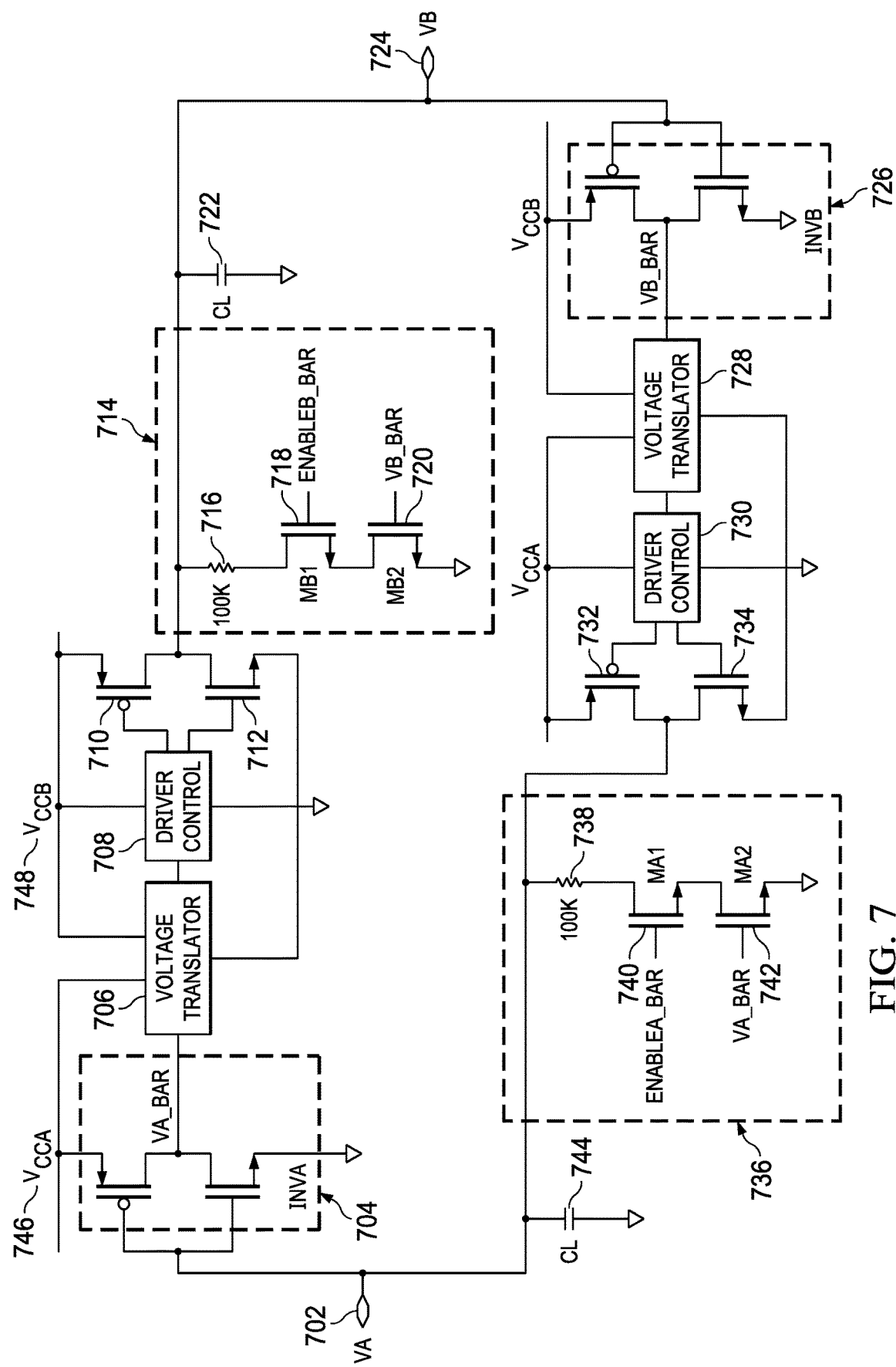
FIG. 7 is a schematic diagram of another example implementation of the bidirectional voltage level translation integrated circuit of FIG. 1.

FIG. 7 is a schematic diagram of a fifth example bidirectional voltage translator 700. In some examples, the fifth bidirectional voltage translator 700 may be an implementation of a single channel (such as channel 0) of the first bidirectional voltage translator 104 of FIG. 1 (such as VA may be equivalent to GPIO0 and VB may be equivalent to PWM0 of FIG. 1). The fifth bidirectional voltage translator 700 includes a first example bus port 702 (identified by VA), a first example inverter 704 (identified by INVA), first example voltage translator circuitry 706, first example driver control circuitry 708, a first example driver transistor 710, a second example driver transistor 712, and first example pull-down circuitry 714, which includes a first example resistor 716, a first example transistor 718 (identified by MB1), and a second example transistor 720 (identified by MB2). The fifth bidirectional voltage translator 700 includes a first example capacitor 722, a second example bus port 724 (identified by VB), a second example inverter 726 (identified by INVB), second example voltage translator circuitry 728, second example driver control circuitry 730, a third example driver transistor 732, a fourth example driver transistor 734, a second example capacitor 744, and second example pull-down circuitry 736, which includes a second example resistor 738, a third example transistor 740 (identified by MA1), and a fourth example transistor 742 (identified by MA2).

The first inverter 704, the first voltage translator circuitry 706, the second voltage translator circuitry 728, the second driver control circuitry 730, and the third driver transistor 732 are adapted to receive a first example voltage 746 (identified by VCCA). The first inverter 704 is to output a voltage VA_BAR, which is an inversion of the voltage received at the first port 702. The first voltage translator circuitry 706, the first driver control circuitry 708, the first driver transistor 710, the second inverter 726, and the second voltage translator circuitry 728 are adapted to receive a second example voltage 748 (identified by VCCB). The second inverter 726 is to output a voltage VB_BAR, which is an inversion of the voltage received at the second port 724.

The first resistor 716 and the second resistor 738 may have a resistance of around 100 kΩ. Conduction of the first transistor 718 is controlled by a first control signal (identified by ENABLEB_BAR), and conduction of the second transistor 720 is controlled by a second control signal (identified by VB_BAR). The first control signal may be enabled (such as set to a logic "high" value) when the output drivers are disabled by not having VCCB above a voltage threshold (such as a UVLO threshold) or disabled by an output disable (OE) port. The second control signal may be enabled by the second port 724 being at a logic low value.

Advantageously, the third bidirectional voltage translator 300 is an improvement over the fifth bidirectional voltage translator 700 because the third bidirectional voltage translator 300 discharges the first capacitor 320 and/or the second capacitor 340 of FIG. 3 immediately in response to disabling one(s) of the output drivers while the fifth bidirectional voltage translator 700 does not immediately discharge the first capacitor 722 and/or the second capacitor 744 of FIG. 7 in response to disabling one(s) of the output drivers. For example, the output voltage at the first bus port 702 of FIG. 7 may discharge through leakage current of the fourth driver transistor 734 until the output voltage reaches a logic low level of the first inverter 704. In some examples, the output voltage at the second bus port 724 of FIG. 7 may discharge through leakage current of the second driver transistor 712 until the output voltage reaches a logic low level of the second inverter 726. In some such examples, the discharge of the output voltage at the one(s) of the bus ports 702, 724 of FIG. 7 may be very slow with respect to the discharge of the output voltage at the one(s) of the bus ports 302, 304 of FIG. 3.

Figure 8:
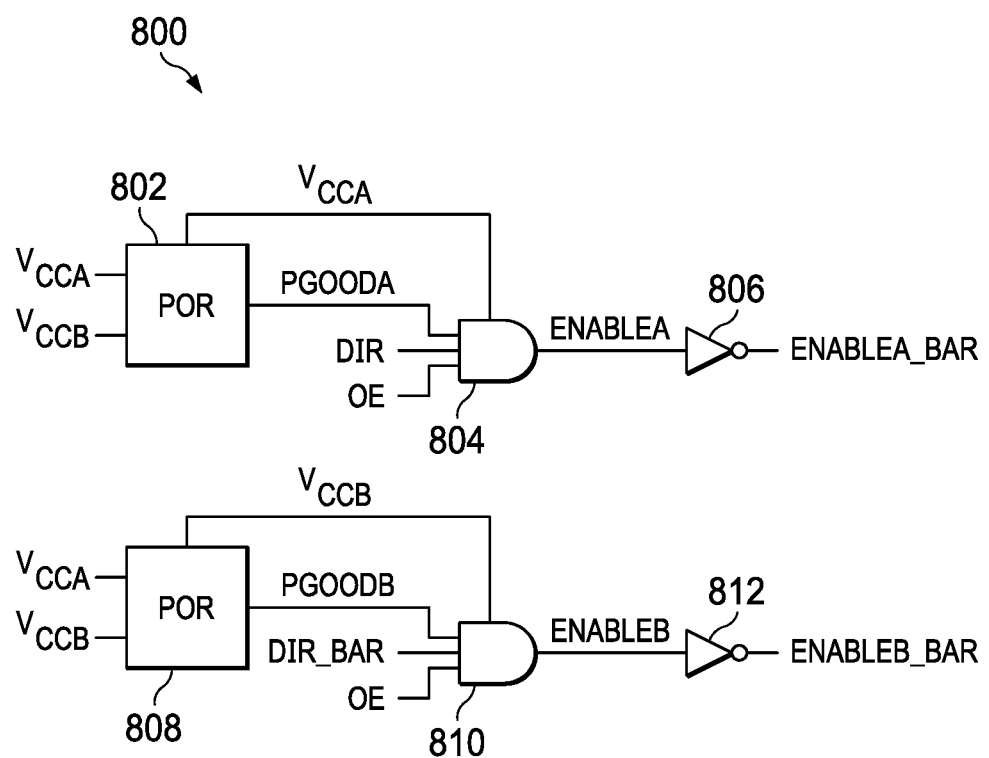
FIG. 8 is a schematic diagram of example control signal generation circuitry.

FIG. 8 is a schematic diagram of example control signal generation circuitry 800. The control signal generation circuitry 800 includes first example power on reset (POR) circuitry 802, a first example logic gate 804, a second example logic gate 806, second example POR circuitry 808, a third example logic gate 810, and a fourth example logic gate 812. The first logic gate 804 and the third logic gate 810 are AND logic gates. The second logic gate 806 and the fourth logic gate 812 are inverters.

The first POR circuitry 802 outputs a first power good signal (identified by PGOODA). The PGOODA signal is disabled (such as set to a logic low value) when VCCA is less than a voltage threshold (such as a UVLO threshold) and enabled (such as a logic high value) when VCCA is greater than the voltage threshold. In response to the PGOODA signal, the direction signal (identified by DIR), and the output enable signal (identified by OE) being enabled, the second logic gate 806 outputs a logic high level for a first enable signal (identified by ENABLEA). The third logic gate 806 inverts the first enable signal and outputs a first inverted enable signal (identified by ENABLEA_BAR). Hence, in response to the logic high level for the first enable signal, logic gate 806 outputs a logic low level for the ENABLEA_BAR signal.

The second POR circuitry 808 outputs a second power good signal (identified by PGOODB). The PGOODB signal is disabled when VCCB is less than a voltage threshold (such as a UVLO threshold) and enabled when VCCB is greater than the voltage threshold. In response to the PGOODB signal, the inverted direction signal (identified by DIR_BAR), and the output enable signal (identified by OE) being enabled, the third logic gate 810 outputs a logic high level for a second enable signal (identified by ENABLEB). The fourth logic gate 812 inverts the second enable signal and outputs a second inverted enable signal (identified by ENABLEB_BAR). Hence, in response to the logic high level for the second enable signal, logic gate 812 outputs a logic low level for the ENABLEB_BAR signal.

Figure 9:
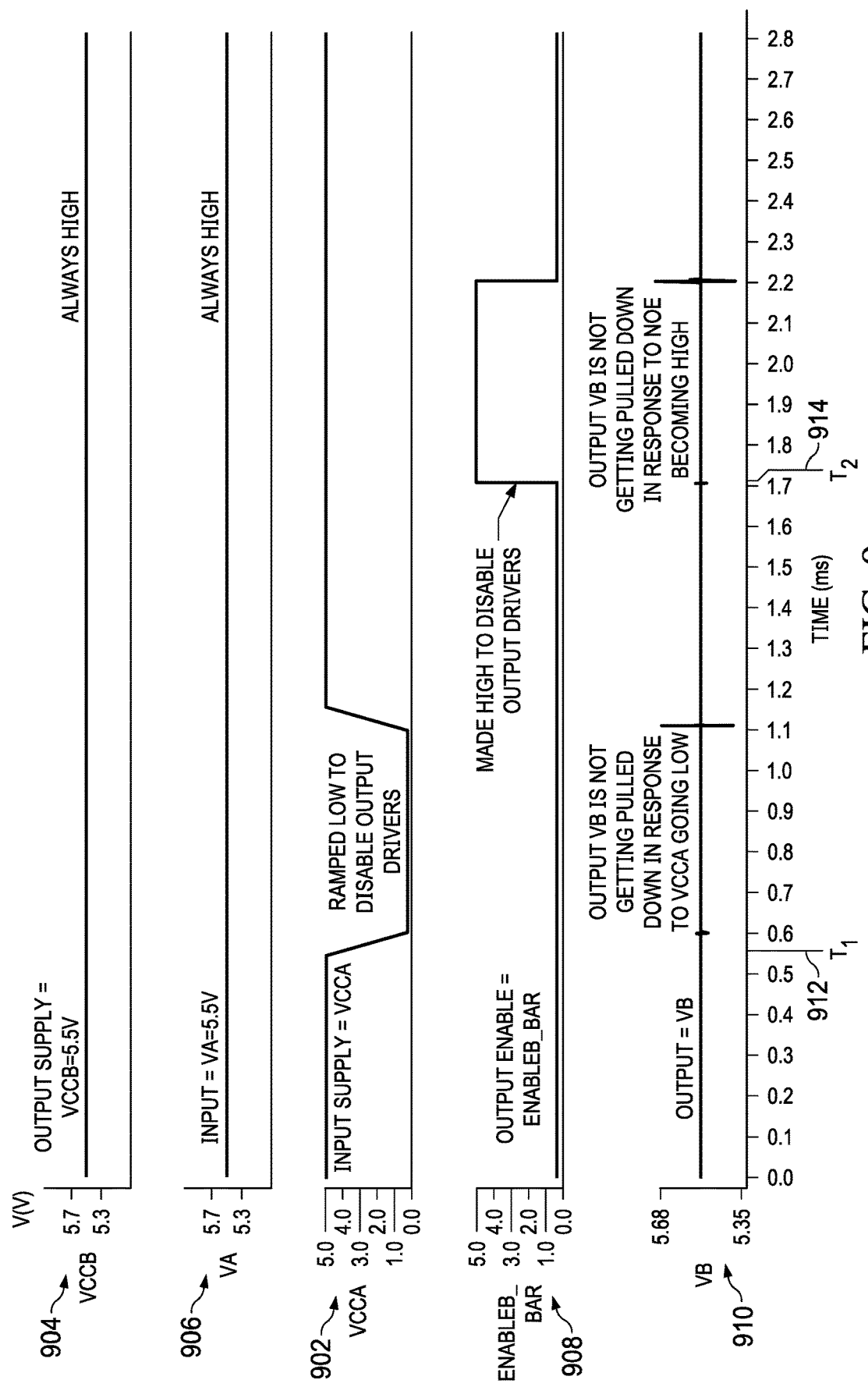
FIG. 9 is a timing diagram corresponding to example operation of the bidirectional voltage level translation integrated circuit of FIG. 7 and/or example operation of the example control signal generation circuitry of FIG. 8.

FIG. 9 is a timing diagram 900 (where the x-axis represents time and the y-axis represents voltage) corresponding to example operation of the fifth bidirectional voltage translator 700 of FIG. 7 and/or example operation of the control signal generation circuitry 800 of FIG. 8. The timing diagram 900 includes an example input supply waveform 902 (identified by VCCA), an example output supply waveform 904 (identified by VCCB), an example input voltage waveform 906 (identified by VA), an example inverted enable waveform 908 (identified by ENABLEB_BAR), and an example output voltage waveform 910 (identified by VB).

In some examples, the input supply waveform 902 may be a waveform corresponding to the first voltage 746 of FIG. 7. In some examples, the output supply waveform 904 may be a waveform corresponding to the second voltage 748 of FIG. 7. In some examples, the input voltage waveform 906 may be a waveform corresponding to a voltage at the first bus port 702 of FIG. 7. In some examples, the inverted enable waveform 908 may be a waveform corresponding to the ENABLEB_BAR signal of FIGS. 7 and/or 8. In some examples, the output voltage waveform 910 may be a waveform corresponding to a voltage at the second bus port 724 of FIG. 7.

In the timing diagram 900 of FIG. 9, at a first example time ($T_1$) 912, VCCA is ramped low to disable the output drivers (such as the first driver control circuitry 708 and/or the second driver control circuitry 730 of FIG. 7) of the fifth bidirectional voltage translator 700. In response to VCCA dropping below a voltage threshold (such as an UVLO threshold), VB is not appreciably pulled down (VB merely decreases slowly due to the leakage current of the output driver transistor). For example VB at the first time 912 is 5.49712V and does not substantively decrease after the first time 912.

At a second example time ($T_2$) 914, ENABLEB_BAR is switched from a logic low signal to a logic high signal to disable the output drivers (such as the first driver control circuitry 708 and/or the second driver control circuitry 730 of FIG. 7) of the fifth bidirectional voltage translator 700. Even though ENABLEB_BAR transitions to the logic high level, VB is not appreciably pulled down (such as getting pulled down to approximately 0V) and, instead, decreases slowly due to the leakage current of the output driver transistor. For example VB at the second time 914 is approximately 5.50155V.

Advantageously, the third bidirectional voltage translator 300 is an improvement over the fifth bidirectional voltage translator 700 because in response to ramping VCCA low to disable the output drivers at the first time 516, VB decreases to approximately 0V in FIG. 5 while VB remains approximately 5V in FIG. 7. Advantageously, the third bidirectional voltage translator 300 is an improvement over the fifth bidirectional voltage translator 700 because in response to switching ENABLEB_BAR to a logic high signal to disable the output drivers at the fifth time 524, VB decreases to approximately 0V in FIG. 5 while VB remains approximately 5V in FIG. 7.

Figure 10:
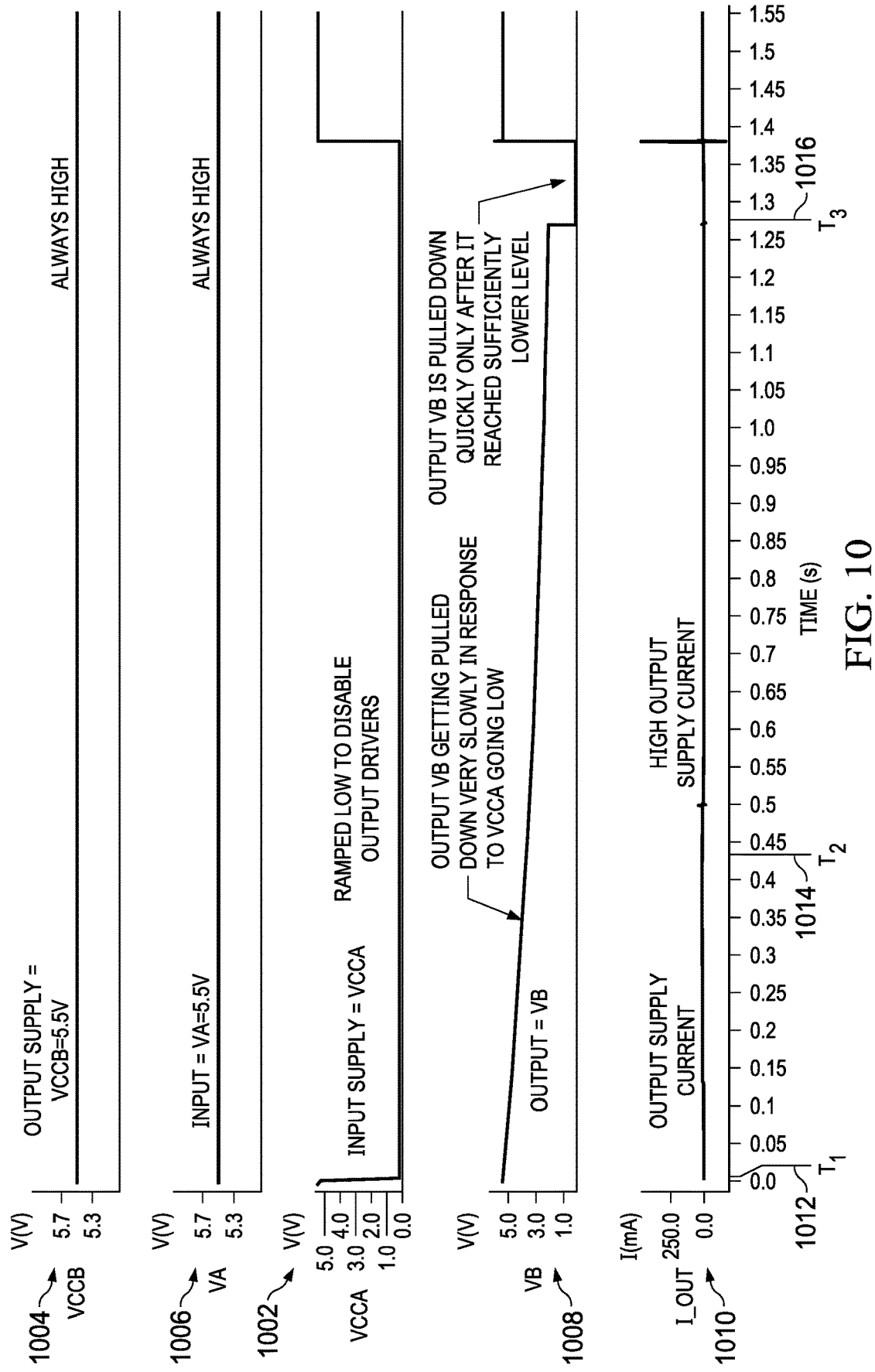
FIG. 10 is another timing diagram corresponding to example operation of the bidirectional voltage level translation integrated circuit of FIG. 7 and/or example operation of the example control signal generation circuitry of FIG. 8.

FIG. 10 is another timing diagram 1000 corresponding to example operation of the fifth bidirectional voltage translator 700 of FIG. 7 and/or example operation of the control signal generation circuitry 800 of FIG. 8. The timing diagram 1000 includes an example input supply waveform 1002 (identified by VCCA), an example output supply waveform 1004 (identified by VCCB), an example input voltage waveform 1006 (identified by VA), an example output voltage waveform 1008 (identified by VB), and an example output current waveform 1010 (identified by I_OUT).

In some examples, the input supply waveform 1002 may be a waveform corresponding to the first voltage 746 of FIG. 7. In some examples, the output supply waveform 1004 may be a waveform corresponding to the second voltage 748 of FIG. 7. In some examples, the input voltage waveform 1006 may be a waveform corresponding to a voltage at the first bus port 702 of FIG. 7. In some examples, the output voltage waveform 1008 may be a waveform corresponding to a voltage at the second bus port 724 of FIG. 7. In some examples, the output current waveform 1010 may be a waveform corresponding to a current at the second bus port 724 of FIG. 7.

In the timing diagram 1000 of FIG. 10, at a first example time ($T_1$) 1012, VCCA is ramped low to disable the output drivers (such as the first driver control circuitry 708 and/or the second driver control circuitry 730 of FIG. 7) of the fifth bidirectional voltage translator 700. In response to VCCA dropping below a voltage threshold (such as an UVLO threshold), VB is pulled down very slowly and I_OUT remains relatively elevated (such as 13.87361 milliamps (mA)) at a second example time ($T_2$) 1014. For example I_OUT at the second time 1014 of FIG. 10 is magnitudes greater than I_OUT at the third time 520 of FIG. 5. Advantageously, the third bidirectional voltage translator 300 is thereby an improvement over the fifth bidirectional voltage translator 700.

At a third example time ($T_3$) 1016, VB is pulled down quickly only after VB reached a sufficiently low level. For example, the fifth bidirectional voltage translator 700 may take over 1.25 seconds (such as a time duration from the first time 1012 to the third time 1016) to decrease VB to approximately 0V. Advantageously, the third bidirectional voltage translator 300 is thereby an improvement over the fifth bidirectional voltage translator 700 because the third bidirectional voltage translator 300 took magnitudes less time to pull down VB to approximately 0V as depicted between the second time 518 and the third time 520 of FIG. 5.

Figure 11:
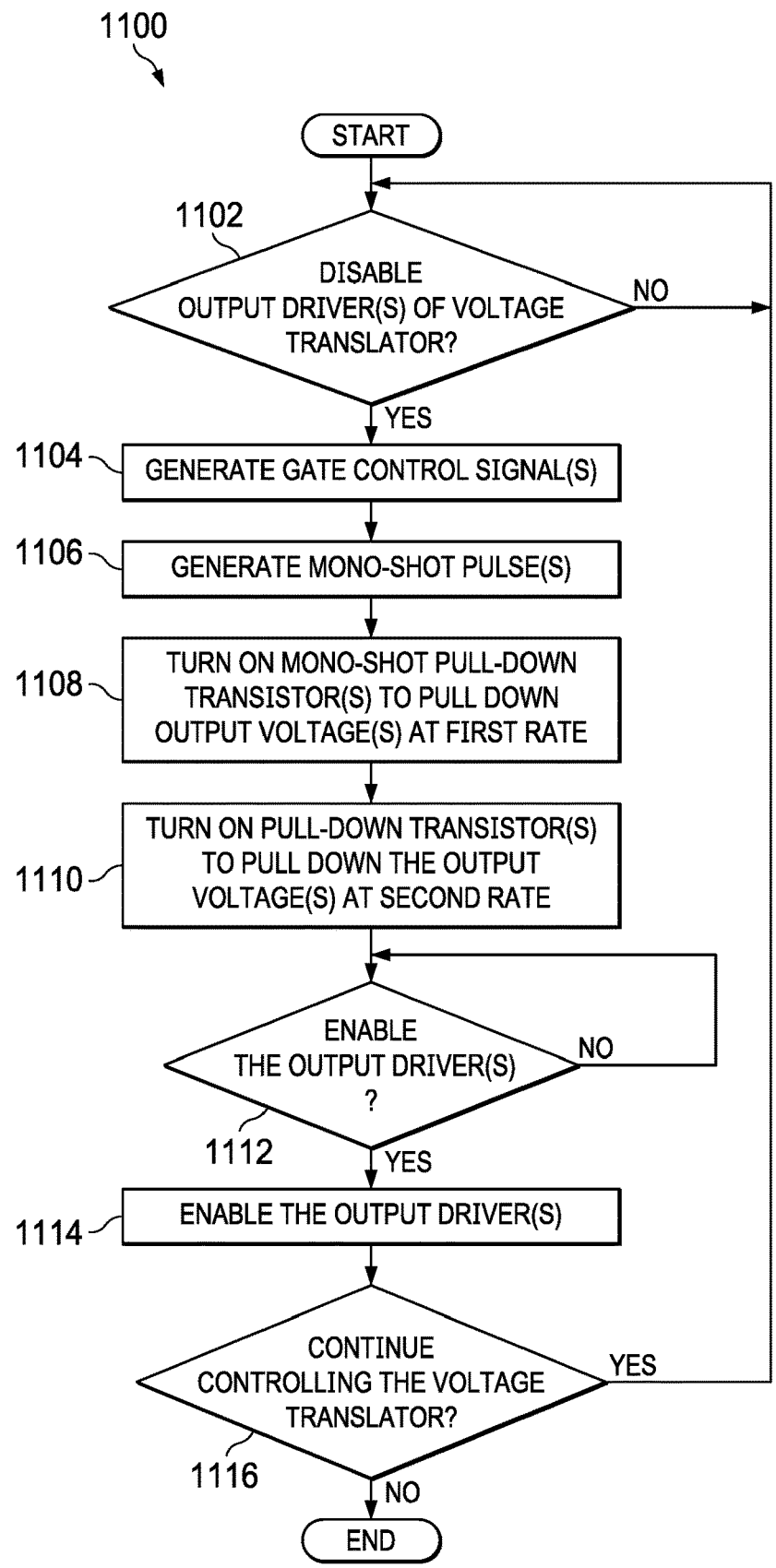
FIG. 11 is a flowchart representative of an example process that may be performed using machine readable instructions that can be executed and/or hardware configured to implement the bidirectional voltage level translation integrated circuit of FIGS. 1, 2, and/or 3, and/or the example mono-shot pulse generation circuitry of FIG. 4 to trigger a dynamic pull down of a voltage at a bidirectional voltage translator output.

FIG. 11 is a flowchart representative of an example process 1100 that may be performed using machine readable instructions that can be executed and/or hardware configured to implement the first bidirectional voltage translator 104 of FIG. 1, the second bidirectional voltage translator 200 of FIG. 2, the third bidirectional voltage translator 300 of FIG. 3, and/or the mono-shot pulse generation circuitry 400 of FIG. 4 to trigger a dynamic pull down of a voltage at a bidirectional voltage translator output (such as the first bus port 302 of FIG. 3, the second bus port 304 of FIG. 3, etc.). The process 1100 begins at block 1102, at which the bidirectional voltage translator 104, 200, 300 determines whether to disable output driver(s) of a voltage translator. For example, the first driver control circuitry 314 (FIG. 3) may determine to turn off the first driver transistor 316 (FIG. 3) and the second driver transistor 317 (FIG. 3) to cause the output nodes (such as the second bus port 304 to become floating or become a high impedance or tristate node. In some such examples, the second driver control circuitry 334 (FIG. 3) may determine to turn off the third driver transistor 336 (FIG. 3) and turn on the fourth driver transistor 337 (FIG. 3).

If, at block 1102, the bidirectional voltage translator 104, 200, 300 determines not to disable the output driver(s) of the voltage translator, control waits at block 1102 until a determination is made to disable the output driver(s) of the voltage translator. If, at block 1102, the bidirectional voltage translator 104, 200, 300 determines to disable the output driver(s) of the voltage translator, then, at block 1104, the bidirectional voltage translator 104, 200, 300 generates gate control signal(s). For example, the first driver control circuitry 314 may generate a first control signal to turn off the first driver transistor 316 and turn on the second driver transistor 317. In some such examples, the second driver control circuitry 334 may generate the first control signal to turn off the third driver transistor 336 and the fourth driver transistor 337 to cause the output nodes (such as the first bus port 302 to become floating or become a high impedance or tristate node.

At block 1106, the bidirectional voltage translator 104, 200, 300 generates mono-shot pulse(s). For example, the first pulse generation circuitry 402 (FIG. 4) may generate a logic high signal for the fourth transistor control signal 364 of (FIG. 3). In some such examples, the second pulse generation circuitry 404 (FIG. 4) may generate a logic high signal for the first transistor control signal 358 (FIG. 3).

At block 1108, the bidirectional voltage translator 104, 200, 300 turns on mono-shot pull-down transistor(s) to pull down output voltage(s) at a first rate. For example, in response to generating a logic high signal as the first transistor control signal 358, the first pulse generation circuitry 402 may turn on the third transistor 328 (FIG. 3). In some such examples, in response to turning on the third transistor 328, the output voltage at the second bus port 304 may be reduced from a first voltage (such as 5.0V, 5.5V, etc.) to a second voltage (such as approximately 0V) at a first rate. In some such examples, the third transistor 328 may be a mono-shot pull-down transistor.

In some examples, in response to generating a logic high signal as the fourth transistor control signal 364, the second pulse generation circuitry 404 may turn on the sixth transistor 348 (FIG. 3). In some such examples, in response to turning on the sixth transistor 348, the output voltage at the first bus port 302 may be reduced from a third voltage (such as 1.0V, 1.1V, etc.) to a fourth voltage (such as approximately 0V) at a third rate. In some such examples, the sixth transistor 348 may be a mono-shot pull-down transistor.

At block 1110, the bidirectional voltage translator 104, 200, 300 turns on pull-down transistor(s) to pull down the output voltage(s) at a second rate. For example, in response to generating a logic high signal as the first transistor control signal 358, circuitry (such as control circuitry, the controller 102 of FIG. 1, etc.) may generate logic high signals for the second transistor control signal 360 (FIG. 3) to turn on the first transistor 324 (FIG. 3), and due to the third transistor 328 pulling down VB to a logic level that is considered low by the second inverter 330, resulting in the third transistor control signal 362 (FIG. 3) to turn on the second transistor 326 (FIG. 3). In some such examples, in response to turning on the first transistor 324 and the second transistor 326, the output voltage at the second bus port 304 may be reduced from the first voltage (such as 5.0V, 5.5V, etc.) to the second voltage (such as approximately 0V) at a second rate. In some such examples, the second rate is different (such as greater than) than the first rate. In some such examples, the first transistor 324 and the second transistor 326 may be pull-down transistors.

In some examples, in response to generating a logic high signal as the fourth transistor control signal 364, circuitry (such as control circuitry, the controller 102 of FIG. 1, etc.) may generate logic high signals for the fifth transistor control signal 366 (FIG. 3) to turn on the fourth transistor 344 (FIG. 3), and due to the sixth transistor 348 pulling down VA to a logic level that is considered low by the first inverter 310, resulting in the sixth transistor control signal 368 (FIG. 3) to turn on the fifth transistor 346 (FIG. 3). In some such examples, in response to turning on the fourth transistor 344 and the fifth transistor 346, the output voltage at the first bus port 302 may be reduced from the first voltage (such as 1.0V, 1.1V, etc.) to the second voltage (such as approximately 0V) at a fourth rate. In some such examples, the fourth rate is different (such as greater than) than the third rate. In some such examples, the fourth transistor 344 and the fifth transistor 346 may be pull-down transistors.

At block 1112, the bidirectional voltage translator 104, 200, 300 determines whether to enable the output driver(s). For example, the first driver control circuitry 314 may determine to turn on the first driver transistor 316 and turn off the second driver transistor 317. In some such examples, the second driver control circuitry 334 may determine to turn on the third driver transistor 336 and turn off the fourth driver transistor 337. If, at block 1112, the bidirectional voltage translator 104, 200, 300 determines to enable the output driver(s), then, at block 1114, the bidirectional voltage translator 104, 200, 300 enables the output driver(s). For example, the first driver control circuitry 314 may generate a second control signal to turn on the first driver transistor 316 and turn off the second driver transistor 317. In some such examples, the second driver control circuitry 334 may generate the second control signal to turn on the third driver transistor 336 and turn off the fourth driver transistor 337.

At block 1116, the bidirectional voltage translator 104, 200, 300 determines whether to continue controlling the voltage translator. For example, the first driver control circuitry 314 may determine to turn off and/or otherwise disable one(s) of the output drivers. If, at block 1116, the bidirectional voltage translator 104, 200, 300 determines to continue controlling the voltage translator, control returns to block 1102 to determine whether to disable the output driver(s) of the voltage translator, otherwise the example process 1100 of FIG. 11 concludes.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve pull-down circuitry in voltage translators, level shifters, transceivers, etc. Example methods, apparatus and articles of manufacture described herein are area efficient solutions to pull down output node voltages relatively quickly to low voltages (such as 0V) to avoid relatively large output supply currents flowing through the circuitry.

Example methods, apparatus, systems, and articles of manufacture for dynamic pull down circuits for bidirectional voltage translators are disclosed herein. Further examples and combinations thereof include the following:

Example 1 includes an apparatus comprising an output terminal, pull-down circuitry coupled to the output terminal, the pull-down circuitry including a resistor with a first resistor terminal and a second resistor terminal, the first resistor terminal coupled to the output terminal, a capacitor with a first capacitor terminal and a second capacitor terminal, the first capacitor terminal coupled to the output terminal, a first transistor coupled to the second resistor terminal, a second transistor coupled to the first transistor and the second resistor terminal, and a third transistor coupled to the second transistor.

Example 2 includes the apparatus of example 1, wherein the first transistor includes a first drain terminal and a first source terminal, the second transistor includes a second drain terminal and a second source terminal, the third transistor includes a third drain terminal, the first drain terminal is coupled to the second resistor terminal and the second drain terminal, and the second source terminal is coupled to the third drain terminal.

Example 3 includes the apparatus of example 2, wherein the first transistor, the second transistor, and the third transistor are N-channel metal-oxide semiconductor field-effect transistors.

Example 4 includes the apparatus of example 1, further including a fourth transistor including a first gate terminal and a first drain terminal, the first drain terminal coupled to the first resistor terminal, the first capacitor terminal, and the output terminal, a fifth transistor including a second gate terminal and a second drain terminal, the second drain terminal coupled to the first drain terminal, the first resistor terminal, the first capacitor terminal, and the output terminal, and driver control circuitry with a first control output and a second control output, the first control output coupled to the first gate terminal, the second control output coupled to the second gate terminal.

Example 5 includes the apparatus of example 4, wherein the output terminal is adapted to output a signal with a first voltage translated from a second voltage, the driver control circuitry including a first control input, and further including voltage translator circuitry including a first voltage translation input, a second voltage translation input, a voltage translation output, and a second control input, the first voltage translation input adapted to receive the first voltage, the second voltage translation input adapted to receive the second voltage, the voltage translation output coupled to the first control input, and an inverter with an inverter output coupled to the second control input.

Example 6 includes the apparatus of example 5, wherein the inverter has an inverter input, and further including an input terminal coupled to the inverter input, the input terminal configured to receive the second voltage.

Example 7 includes the apparatus of example 1, further including mono-shot pulse generation circuitry coupled to the first transistor.

Example 8 includes the apparatus of example 7, wherein the resistor is a first resistor, the capacitor is a first capacitor, and the mono-shot pulse generation circuitry includes a first logic gate including a first logic gate output, a second logic gate including a first logic gate input, a second logic gate input, and a second logic gate output, the first logic gate input coupled to the first logic gate output, the second logic gate output coupled to the first transistor, a second resistor including a first resistor terminal and a second resistor terminal, the first resistor terminal coupled to the first logic gate output and the first logic gate input, the second resistor terminal coupled to the second logic gate input, and a second capacitor including a capacitor terminal coupled to the second resistor terminal.

Example 9 includes the apparatus of example 8, wherein the first transistor includes a gate terminal, and the mono-shot pulse generation circuitry is coupled to the gate terminal.

Example 10 includes the apparatus of example 8, wherein the first logic gate is an AND logic gate and the second logic gate is an exclusive OR logic gate.

Example 11 includes a transceiver comprising an input terminal adapted to receive a first voltage, an output terminal adapted to output a second voltage, first transceiver path circuitry coupled to the input terminal and the output terminal, and second transceiver path circuitry coupled to the input terminal, the output terminal, and the first transceiver path circuitry, the second transceiver path circuitry including a resistor with a first resistor terminal and a second resistor terminal, the first resistor terminal coupled to the output terminal, a capacitor with a first capacitor terminal and a second capacitor terminal, the first capacitor terminal coupled to the output terminal, a first transistor coupled to the second resistor terminal, a second transistor coupled to the first transistor and the second resistor terminal, and a third transistor coupled to the second transistor.

Example 12 includes the transceiver of example 11, wherein the resistor is a first resistor, the capacitor is a first capacitor, and further including mono-shot pulse generation circuitry including a first logic gate including a first logic gate output, a second logic gate including a first logic gate input, a second logic gate input, and a second logic gate output, the first logic gate input coupled to the first logic gate output, the second logic gate output coupled to the first transistor, a second resistor including a first resistor terminal and a second resistor terminal, the first resistor terminal coupled to the first logic gate output and the first logic gate input, the second resistor terminal coupled to the second logic gate input, and a second capacitor including a capacitor terminal coupled to the second resistor terminal.

Example 13 includes the transceiver of example 11, wherein the second transceiver path circuitry includes an inverter coupled to the input terminal, voltage translator circuitry coupled to the inverter, driver control circuitry coupled to the voltage translator circuitry, and a fourth transistor and a fifth transistor coupled to the driver control circuitry, the resistor, the capacitor, the output terminal, and the first transceiver path circuitry.

Example 14 includes the transceiver of example 13, wherein the inverter is a first inverter, the voltage translator circuitry is first voltage translator circuitry, the driver control circuitry is first driver control circuitry, and the first transceiver path circuitry includes a second inverter coupled to the output terminal, second voltage translator circuitry coupled to the second inverter, second driver control circuitry coupled to the second voltage translator circuitry, and a sixth transistor and a seventh transistor coupled to the second driver control circuitry, and pull-down circuitry, the pull-down circuitry coupled to the input terminal.

Example 15 includes the transceiver of example 11, wherein the input terminal is a first data terminal, the output terminal is a second data terminal, and the first transceiver path circuitry is to receive data with the first voltage at the first data terminal, translate the first voltage to the second voltage, and output the data with the second voltage at the second data terminal.

Example 16 includes the transceiver of example 15, wherein the data is first data, and the second transceiver path circuitry is to receive second data with the second voltage at the second data terminal, translate the second voltage to the first voltage, and output the second data with the first voltage at the first data terminal.

Example 17 includes a system comprising a bidirectional voltage translator including voltage translator circuitry adapted to receive a first signal with a first voltage at an input terminal and output the first signal with a second voltage at an output terminal, and pull-down circuitry to pull down the second voltage to a third voltage in response to the output of the first signal with the second voltage, and a controller coupled to the bidirectional voltage translator, the controller to generate the first signal, and generate a control signal to turn on the pull-down circuitry to pull down the second voltage to the third voltage.

Example 18 includes the system of example 17, wherein the controller is a first controller, and further including a load coupled to the output terminal, and the load is one of a light-emitting diode, a transistor, an audio device, or a second controller.

Example 19 includes the system of example 17, wherein the pull-down circuitry includes a resistor with a first resistor terminal and a second resistor terminal, the first resistor terminal coupled to the output terminal, a capacitor with a first capacitor terminal and a second capacitor terminal, the first capacitor terminal coupled to the output terminal, a first transistor coupled to the second resistor terminal, a second transistor coupled to the first transistor and the second resistor terminal, and a third transistor coupled to the second transistor.

Example 20 includes the system of example 17, further including mono-shot pulse generation circuitry including a first logic gate including a first logic gate output, a second logic gate including a first logic gate input, a second logic gate input, and a second logic gate output, the first logic gate input coupled to the first logic gate output, the second logic gate output coupled to the pull-down circuitry, a second resistor including a first resistor terminal and a second resistor terminal, the first resistor terminal coupled to the first logic gate output and the first logic gate input, the second resistor terminal coupled to the second logic gate input, and a second capacitor including a capacitor terminal coupled to the second resistor terminal.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. An apparatus comprising:
pull-down circuitry having an output and a first input, a second input and a third input, the pull-down circuitry including:
a resistor with a first resistor terminal and a second resistor terminal, the first resistor terminal coupled to the output;
a capacitor with a first capacitor terminal and a second capacitor terminal, the first capacitor terminal coupled to the output and the second capacitor terminal coupled to ground;
a first transistor having a first current terminal, a second current terminal and a control terminal, wherein the first current terminal of the first transistor is coupled to the second resistor terminal, the second current terminal of the first transistor is coupled to ground and the control terminal of the first transistor is coupled to the first input;
a second transistor having a first current terminal, a second current terminal and a control terminal, wherein the first current terminal of the second transistor is coupled to the second resistor terminal and the control terminal of the second transistor is coupled to the second input; and a third transistor having a first current terminal, a second current terminal and a control terminal wherein the first current terminal of the third transistor is coupled to the second current terminal of the second transistor, the second current terminal of the third transistor is coupled to ground and the control terminal of the third transistor is coupled to the third input.

2. The apparatus of claim 1, wherein the first transistor, the second transistor, and the third transistor are N-channel metal-oxide semiconductor field-effect transistors.

3. The apparatus of claim 1, further including:
a fourth transistor including a first gate terminal and a first drain terminal, the first drain terminal coupled to the first resistor terminal, the first capacitor terminal, and the output;
a fifth transistor including a second gate terminal and a second drain terminal, the second drain terminal coupled to the first drain terminal, the first resistor terminal, the first capacitor terminal, and the output; and
driver control circuitry with a first control output and a second control output, the first control output coupled to the first gate terminal, the second control output coupled to the second gate terminal.

4. The apparatus of claim 3, wherein the output is adapted to output a signal with a first voltage translated from a second voltage, the driver control circuitry including a first control input, and further including:
voltage translator circuitry including a first voltage translation input, a second voltage translation input, a voltage translation output, and a second control input, the first voltage translation input adapted to receive the first voltage, the second voltage translation input adapted to receive the second voltage, the voltage translation output coupled to the first control input; and
an inverter with an inverter output coupled to the second control input.

5. The apparatus of claim 4, wherein the inverter has an inverter input, and further including an input terminal coupled to the inverter input, the input terminal configured to receive the second voltage.

6. The apparatus of claim 1, further including mono-shot pulse generation circuitry coupled to the first transistor.

7. The apparatus of claim 6, wherein the resistor is a first resistor, the capacitor is a first capacitor, and the mono-shot pulse generation circuitry includes:
a first logic gate including a first logic gate output;
a second logic gate including a first logic gate input, a second logic gate input, and a second logic gate output, the first logic gate input coupled to the first logic gate output, the second logic gate output coupled to the first transistor;
a second resistor including a first resistor terminal and a second resistor terminal, the first resistor terminal coupled to the first logic gate output and the first logic gate input, the second resistor terminal coupled to the second logic gate input; and
a second capacitor including a capacitor terminal coupled to the second resistor terminal.

8. The apparatus of claim 7, wherein the first transistor includes a gate terminal, and the mono-shot pulse generation circuitry is coupled to the gate terminal.

9. The apparatus of claim 7, wherein the first logic gate is an AND logic gate and the second logic gate is an exclusive OR logic gate.

10. A transceiver comprising:
first transceiver path circuitry having a first input, and output; and
second transceiver path circuitry coupled to the first input and the output, and having a second input and a third input, the second transceiver path circuitry including:
a resistor with a first resistor terminal and a second resistor terminal, the first resistor terminal coupled to the output;
a capacitor with a first capacitor terminal and a second capacitor terminal, the first capacitor terminal coupled to the output and the second capacitor terminal coupled to ground;
a first transistor having a first current terminal, a second current terminal and a control terminal, wherein the first current terminal of the first transistor is coupled to the second resistor terminal, the second current terminal of the first transistor is coupled to ground and the control terminal of the first transistor is coupled to the first input;
a second transistor having a first current terminal, a second current terminal and a control terminal, wherein the first current terminal of the second transistor is coupled to the second resistor terminal and the control terminal of the second transistor is coupled to the second input; and
a third transistor having a first current terminal, a second current terminal and a control terminal wherein the first current terminal of the third transistor is coupled to the second current terminal of the second transistor, the second current terminal of the third transistor is coupled to ground and the control terminal of the third transistor is coupled to the third input.

11. The transceiver of claim 10, wherein the resistor is a first resistor, the capacitor is a first capacitor, and further including mono-shot pulse generation circuitry including:
a first logic gate including a first logic gate output;
a second logic gate including a first logic gate input, a second logic gate input, and a second logic gate output, the first logic gate input coupled to the first logic gate output, the second logic gate output coupled to the first transistor;
a second resistor including a first resistor terminal and a second resistor terminal, the first resistor terminal coupled to the first logic gate output and the first logic gate input, the second resistor terminal coupled to the second logic gate input; and
a second capacitor including a capacitor terminal coupled to the second resistor terminal.

12. The transceiver of claim 10, wherein the second transceiver path circuitry includes:
an inverter coupled to the input;
voltage translator circuitry coupled to the inverter;
driver control circuitry coupled to the voltage translator circuitry; and
a fourth transistor and a fifth transistor coupled to the driver control circuitry, the resistor, the capacitor, the output, and the first transceiver path circuitry.

13. The transceiver of claim 12, wherein the inverter is a first inverter, the voltage translator circuitry is first voltage translator circuitry, the driver control circuitry is first driver control circuitry, and the first transceiver path circuitry includes:
a second inverter coupled to the output;
second voltage translator circuitry coupled to the second inverter;

second driver control circuitry coupled to the second voltage translator circuitry; and a sixth transistor and a seventh transistor coupled to the second driver control circuitry, and pull-down circuitry, the pull-down circuitry coupled to the input.

14. The transceiver of claim 10, wherein the input is a first data terminal, the output is a second data terminal, and the first transceiver path circuitry is to:

receive data with a first voltage at the first data terminal;

translate the first voltage to a second voltage; and output the data with the second voltage at the second data terminal.

15. The transceiver of claim 14, wherein the data is first data, and the second transceiver path circuitry is to:

receive second data with the second voltage at the second data terminal;

translate the second voltage to the first voltage;

and output the second data with the first voltage at the first data terminal.

* * * * *